US 7,029,289 B2

(12) United States Patent
Li

(10) Patent No.: US 7,029,289 B2
(45) Date of Patent: Apr. 18, 2006

(54) INTERCONNECTION DEVICE AND SYSTEM

(75) Inventor: Che-Yu Li, Roslyn, NY (US)

(73) Assignee: Che-Yu Li & Company LLC, Ithaca, NY (US)

( * ) Notice: Subject to any disclaimer, the term of this patent is extended or adjusted under 35 U.S.C. 154(b) by 0 days.

(21) Appl. No.: 11/082,364

(22) Filed: Mar. 17, 2005

(65) Prior Publication Data

US 2005/0164534 A1    Jul. 28, 2005

Related U.S. Application Data

(63) Continuation-in-part of application No. 10/736,280, filed on Dec. 15, 2003.

(60) Provisional application No. 60/462,143, filed on Apr. 8, 2003, provisional application No. 60/457,258, filed on Mar. 25, 2003, provisional application No. 60/457,076, filed on Mar. 24, 2003.

(51) Int. Cl.
*H01R 12/00* (2006.01)

(52) U.S. Cl. .......................... 439/66; 439/91; 439/591; 439/108

(58) Field of Classification Search ................. 439/66, 439/86, 525, 840, 402, 936, 91, 70, 514–515, 439/71, 700, 108, 817, 295; 29/825, 830, 29/878, 446, 879, 842, 599, 845, 884, 628, 29/874, 976; 361/719, 86
See application file for complete search history.

(56) References Cited

U.S. PATENT DOCUMENTS

| | | | |
|---|---|---|---|
| 2,153,177 A | 4/1939 | Ecker | |
| 3,317,885 A | 5/1967 | Yost | |
| 3,686,926 A | * 8/1972 | Miller et al. ............... | 73/61.72 |
| 3,783,736 A | 1/1974 | Richardson | |
| 3,795,884 A | 3/1974 | Kotaka | |
| 4,029,375 A | 6/1977 | Gabrielian | |
| 4,275,638 A | 6/1981 | DeYoung | |
| 4,810,213 A | 3/1989 | Chabot | |
| 4,820,376 A | 4/1989 | Lambert et al. | |
| 4,838,815 A | 6/1989 | Tajima et al. | |
| 4,922,376 A | 5/1990 | Pommer et al. | |
| 5,030,109 A | 7/1991 | Dery | |
| 5,061,191 A | 10/1991 | Casciotti et al. | |
| 5,085,211 A | 2/1992 | Zavasnik et al. | |

(Continued)

OTHER PUBLICATIONS

FCI—Product Catalog—Technical Library. Trade literature, 2 pages, http://www.bergelect.com/products/technical_01_12.asp.

*Primary Examiner*—Gary F. Paumen
*Assistant Examiner*—Edwin A. Leon
(74) *Attorney, Agent, or Firm*—Duane Morris LLP

(57) ABSTRACT

A connector system including first housing having a first header, the first header including one or more conductive pads that are in electrical communication with a conductor. A second housing that is mateable with the first housing and includes a second header positioned on a mating face. The second header includes one or more conductive pad that are electrically engaged with a conductor and positioned in confronting relation with the one or more conductive pads of the first header. An interposer located between the first header and the second header, with a woven contact that extends continuously through the interposer toward conductive pads on the first and second headers. The interposer is movable between a first position where the woven contact is spaced away from the at least one of the conductive pads, and a second position where woven contact electrically engages one of the conductive pads.

22 Claims, 21 Drawing Sheets

U.S. PATENT DOCUMENTS

| | | |
|---|---|---|
| 5,101,553 A | 4/1992 | Carey |
| 5,127,837 A | 7/1992 | Shah et al. |
| 5,215,472 A | 6/1993 | DelPrete et al. |
| 5,228,861 A | 7/1993 | Grabbe |
| 5,232,372 A | 8/1993 | Bradley et al. |
| 5,257,571 A | 11/1993 | Richardson |
| 5,308,252 A | 5/1994 | Mroczkowski et al. |
| 5,350,308 A | 9/1994 | Laska et al. |
| 5,385,477 A | 1/1995 | Vaynkof et al. |
| 5,403,194 A | 4/1995 | Yamazaki |
| 5,427,535 A | 6/1995 | Sinclair |
| 5,473,510 A | 12/1995 | Dozier, II |
| 5,495,397 A | 2/1996 | Davidson et al. |
| 5,599,193 A | 2/1997 | Crotzer |
| 5,653,598 A | 8/1997 | Grabbe |
| 5,791,914 A | 8/1998 | Loranger et al. |
| 5,800,184 A | 9/1998 | Lopergolo et al. |
| 5,806,181 A | 9/1998 | Khandros et al. |
| 5,810,607 A | 9/1998 | Shih et al. |
| 5,817,986 A | 10/1998 | Davidson et al. |
| 5,823,792 A | 10/1998 | Regnier |
| 5,833,471 A | 11/1998 | Selna |
| 5,931,077 A | 8/1999 | DeYoung |
| 5,949,029 A | 9/1999 | Crotzer et al. |
| 6,047,219 A | 4/2000 | Eidson |
| 6,242,476 B1 | 6/2001 | Mita et al. |
| 6,264,476 B1 * | 7/2001 | Li et al. ..................... 439/66 |
| 6,312,266 B1 * | 11/2001 | Fan et al. ................... 439/91 |
| 6,439,894 B1 * | 8/2002 | Li ............................. 439/66 |
| 6,659,778 B1 * | 12/2003 | Li ............................. 439/66 |
| 6,695,623 B1 * | 2/2004 | Caletka et al. ............. 439/66 |
| 6,716,038 B1 * | 4/2004 | Garcia ....................... 439/75 |
| 6,821,145 B1 | 11/2004 | DeSantis et al. |

* cited by examiner

INTERCONNECTION DEVICE AND SYSTEM

This application is a continuation-in-part of copending patent application Ser. No. 10/736,280, filed Dec. 15, 2003, and entitled Electrical Contact, which application claims the benefit of U.S. Provisional Patent Application No. 60/457,076, filed Mar. 24, 2003, U.S. Provisional Patent Application No. 60/457,258, filed Mar. 25, 2003, and U.S. Provisional Patent Application No. 60/462,143, filed Apr. 8, 2003, and is also related to U.S. Provisional Patent Application No. 60/586,777, filed on Jul. 9, 2004.

FIELD OF THE INVENTION

The present invention generally relates to the electrical interconnection devices, and more particularly to electrical connectors that are at the interface between a first electronic device and a substrate, mating electrical connector, or a circuit board within an electronic system.

BACKGROUND OF THE INVENTION

Electrical connectors are used in many electronic systems. As miniaturization of the electronic systems becomes more prevalent, the dimensions of the connector itself decrease but the number of signal circuits routed through the connector increases. This results in an increasing number of signals in the limited space of the connector. As the signal circuits are spaced closer and the transmission speed of the signals increases, electromagnetic interference (EMI) and crosstalk become a serious problem. It is desirable that the components of an interconnection path be optimized for signal transmission characteristics; otherwise, the integrity of the system will be impaired or degraded. Such characteristics include low inductance, increased current carrying capacity, suitable roll-off, and reduced ground bounce. Continuous efforts have been made to develop electrical connectors that have as little effect as possible on electronic system performance and integrity.

Inductance is one concern in designing a connector, particularly when that connector is to be used in a signal transmission portion of a high speed electronic system. An example of one such connector is a so called "board-to-board" connector. A board-to-board connector provides the electrical, and often mechanical interface between printed circuit boards (PCB's) in an electronic system. Such connectors often have an elongated housing defining an elongated array of receptacles or slots for receiving a mating edge of the printed circuit board, or a field of pins projecting from the surface of the PCB that are mated to a corresponding field of contact receptacles. In many applications, such connectors are mounted on two or more PCB's commonly referred to as "daughter boards", which are mounted to a "mother board."

An inductive effect results from the interconnection of the PCB's which acts to change the characteristic impedance of the circuit and thereby negatively affect the signal transmission capacity of the system. Accordingly, it is desirable to reduce the inductive effects due to the interconnection of the PCB's, and thereby fulfill a need for an interconnection system that reduces inductive effects between the boards being connected. It would also be desirable to increase the current carrying capacity between the PCB's. Examples of such prior art board-to-board connectors may be found in U.S. Pat. Nos.: 6,790,048; 6,776,668; 6,733,305; 6,729,890; 6,609,914; 6,599,138; 6,464,515; 6,338,630; 6,312,263; 6,183,315; 6,089,883; 6,220,903; 6,059,610; 6,036,504; 5,921,787; 5,876,219; and 5,873,742, which patents are hereby incorporated herein by reference.

Electrical connectors are often used in environments where they are exposed to dust and dirt, and may even be used in environments where they are subject to splash or immersion in water. It is desirable to seal the connector assembly to protect the terminals from exposure to the external environment. Very often the connector bodies are each formed with a plurality of passages that extend into the connector bodies from a cable end, and into which the cables and their terminals are received. In a sealed connector application, a seal is provided about the cable such that, when installed in the corresponding passage, it serves to seal the passage from the outside environment. The connectors are also sometimes filled with a potting material which will cover the rear entry of the electrical connector so as to protect it from the ingress of contaminants. It is necessary to prevent the entry of contaminants into the interior of the electrical connector, since these contaminants corrode the electrical contact surfaces which often leads to intermittent or unreliable electrical connections. Many types of seals and sealed connector systems are known for keeping contaminants from entering an electrical connector housing. Examples of such prior art sealed connector systems may be found in U.S. Pat. Nos. 6,821,145; 6,767,250; 6,547,584; 6,383,003; 6,132,251; 6,109,945; 6,050,839; 5,823,824; 5,785,544; 5,775,944; 5,595,504; 5,356,304; 4,983,344; 4,961,713; 4,944,688; 4,934,959; 4,895,529; 4,832,615; 4,776,813; 4,772,231; 4,085,993; 4,150,866; and 4,639,061, which patents are hereby incorporated herein by reference.

All of the foregoing connector systems rely upon one or more resilient conductive contacts having a variety of shapes, sizes, and spring characteristics. A commonly used form of resilient conductive contact includes an interconnection end for matting with a corresponding end of a mating contact or PCB, and a termination end for terminating a circuit trace or wire. These ends are often connected by a resilient portion of the contact which provides for the storage of elastic energy. Prior art resilient conductive contacts may be a single metal structure in the form of a spring to provide the required elastic response during service while also serving as a conductive element for electrical connection. Typically, a combination of barrier metal and noble metal platings are applied to the surface of the spring for corrosion prevention and for electrical contact enhancement. It is often the case that these platings are not of sufficient thickness for electrical conduction along only the surface of the spring. Examples of such prior art resilient conductive contacts may be found in U.S. Pat. Nos. 5,653,598; 5,173,055; 5,059,143; 4,906,194; 4,927,369; 4,699,593; and 4,354,729, which patents are hereby incorporated herein by reference.

One problem in the art exists in that a good material for the construction of a spring, such as a high strength steel, is not a very good electrical conductor. On the other hand, a good electrical conductor, such as a copper alloy or precious metal, often does not provide adequate spring properties. There has been a need in the connector arts for a more resilient conductive contact which incorporates the seemingly opposing requirements of good spring properties, temperature resistance, and high conductivity. Therefore, an improved electrical contact for use in an electrical connector is needed which can overcome the drawbacks of conventional electrical contacts. It is desirable that a good electrical contact element possess the following attributes: (a) usable in a wide variety of inter-connection structures; (b) a large elastic compliance range and low contact forces; (c) capable of transmitting high frequency signals and high currents; (d) capable of withstanding high operating temperatures; and (e) exhibiting high durability, i.e. >500K repeated deflections.

The prior art has been devoid of at least one of the foregoing attributes necessary for a universally applicable electrical connector.

SUMMARY OF THE INVENTION

The present invention provides a connector system including a first housing having a first header positioned on a mating face. The first header includes at least one conductive pad that is electrically engaged with a conductor such as a wire. A second housing is provided that is mateable with the first housing, and includes a second header positioned on a mating face. The second header includes at least one conductive pad that is electrically engaged with a conductor, such as a wire, and is positioned in confronting relation with the at least one conductive pad of the first header. A contact interposer is located between the first header and the second header. The contact interposer includes at least one contact that extends continuously through the contact interposer so as to have a portion projecting outwardly toward the at least one conductive pad of the first header and another portion projecting outwardly toward the at least one conductive pad of the second header. The contact interposer is movable between (i) a first position in which the portions of the at least one contact are spaced away from the conductive pads, and (ii) a second position in which the portions of the at least one contact electrically engage both of the conductive pads.

The at least one contact is often formed from a precursor material, such as an etched or stamped metal sheet, or a plurality of interlaced metal wires. The precursor materials may be formed into a tube or other appropriate shape, and annealed to set their structural form. The annealed structure may then be cut into short segments to form a plurality of individual electrical contacts. The precursor materials are often formed by photo-etching a sheet of conductive material into a mesh with openings of predetermined size and shape. The mesh may also be made by stamping with a conventional metal working die. Alternatively, the precursor material may be made by manipulating a plurality of wires so as to interlace the wires into a unitary structure in the form of a mesh. This embodiment of electrical contact is often formed by weaving or braiding a plurality of wires together to form a mesh, annealing the mesh, and cutting the annealed mesh so as to form a plurality of individual electrical contacts that each have an extended elastic range as a result of the annealing process. The preferred structural forms include woven and folded structures of one or more pleats formed from the precursor material. Such a folded structure can be made by pressing a unitary mesh structure in a die adapted to form pleated or folded structure in the mesh, followed by annealing the pleated or folded mesh while resident in the die to set permanently the structural form. It is then cut to form individual electrical contacts. The desired form of the electrical contact can be made by first rolling a portion of the precursor material in to a tube and followed by annealing under a constraint to set the form factor permanently. The tubular structure is then cut into short segments to form individual electrical contacts.

BRIEF DESCRIPTION OF THE DRAWINGS

These and other features and advantages of the present invention will be more fully disclosed in, or rendered obvious by, the following detailed description of the preferred embodiments of the invention, which are to be considered together with the accompanying drawings wherein like numbers refer to like parts and further wherein.

DETAILED DESCRIPTION OF THE PREFERRED EMBODIMENT

Figure 1:
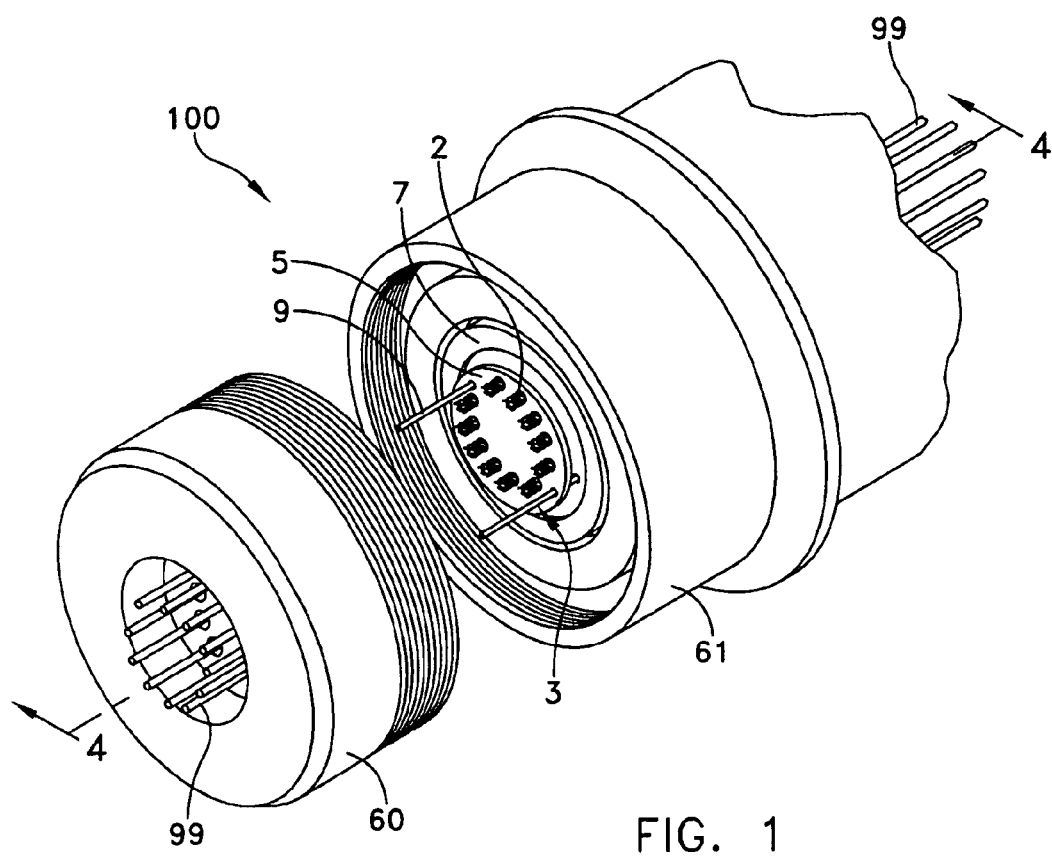
FIG. 1 is a perspective view of a wire-to-wire connector assembly formed in accordance with the present invention.

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses, if used, are intended to cover the structures described, suggested, or rendered obvious by the written description or drawings for performing the recited function, including not only structural equivalents but also equivalent structures.

Figure 16:
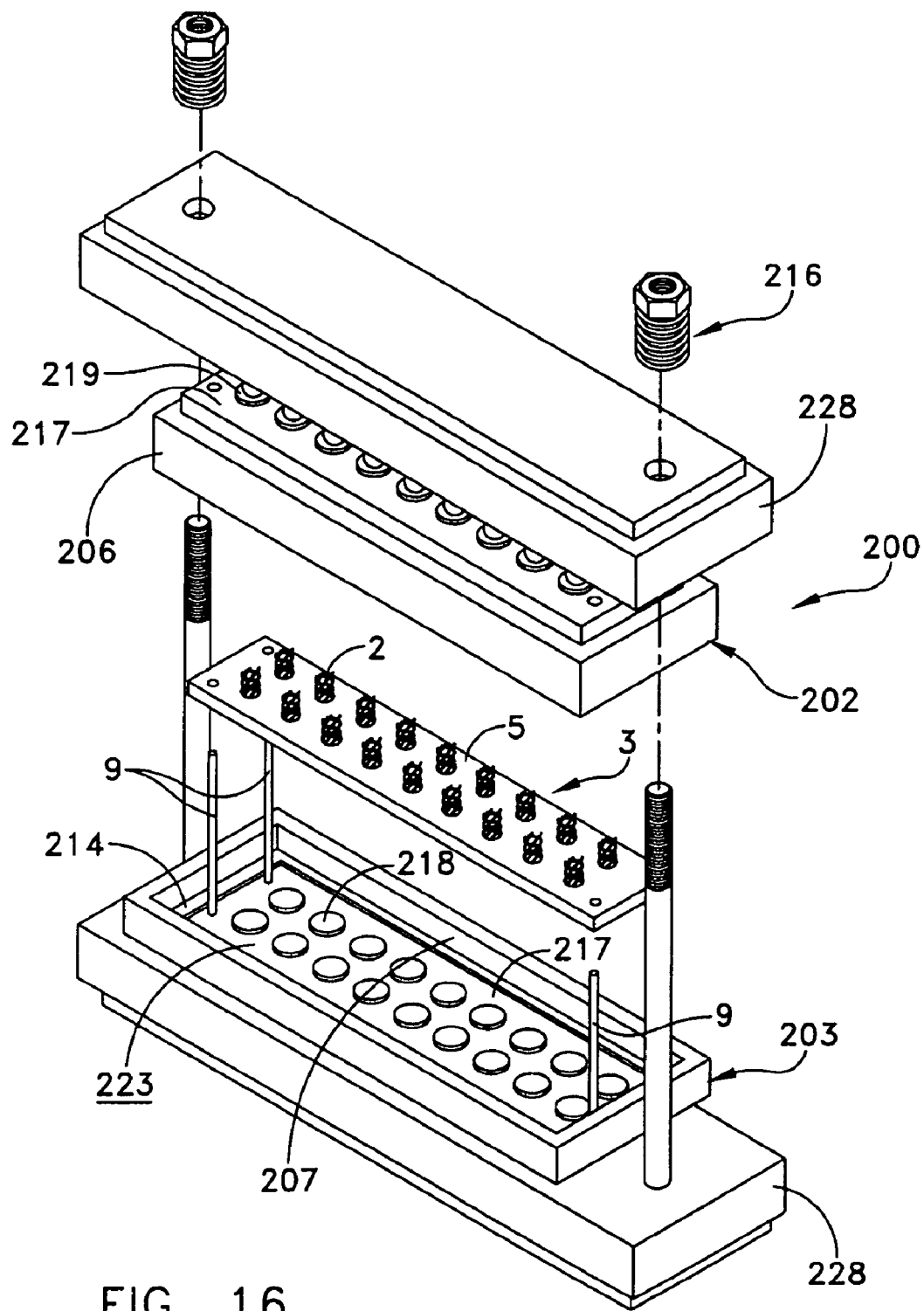
FIG. 16 is a perspective view of an alternative embodiment of the present invention arranged in a board-to-board connector system.
Figure 22:
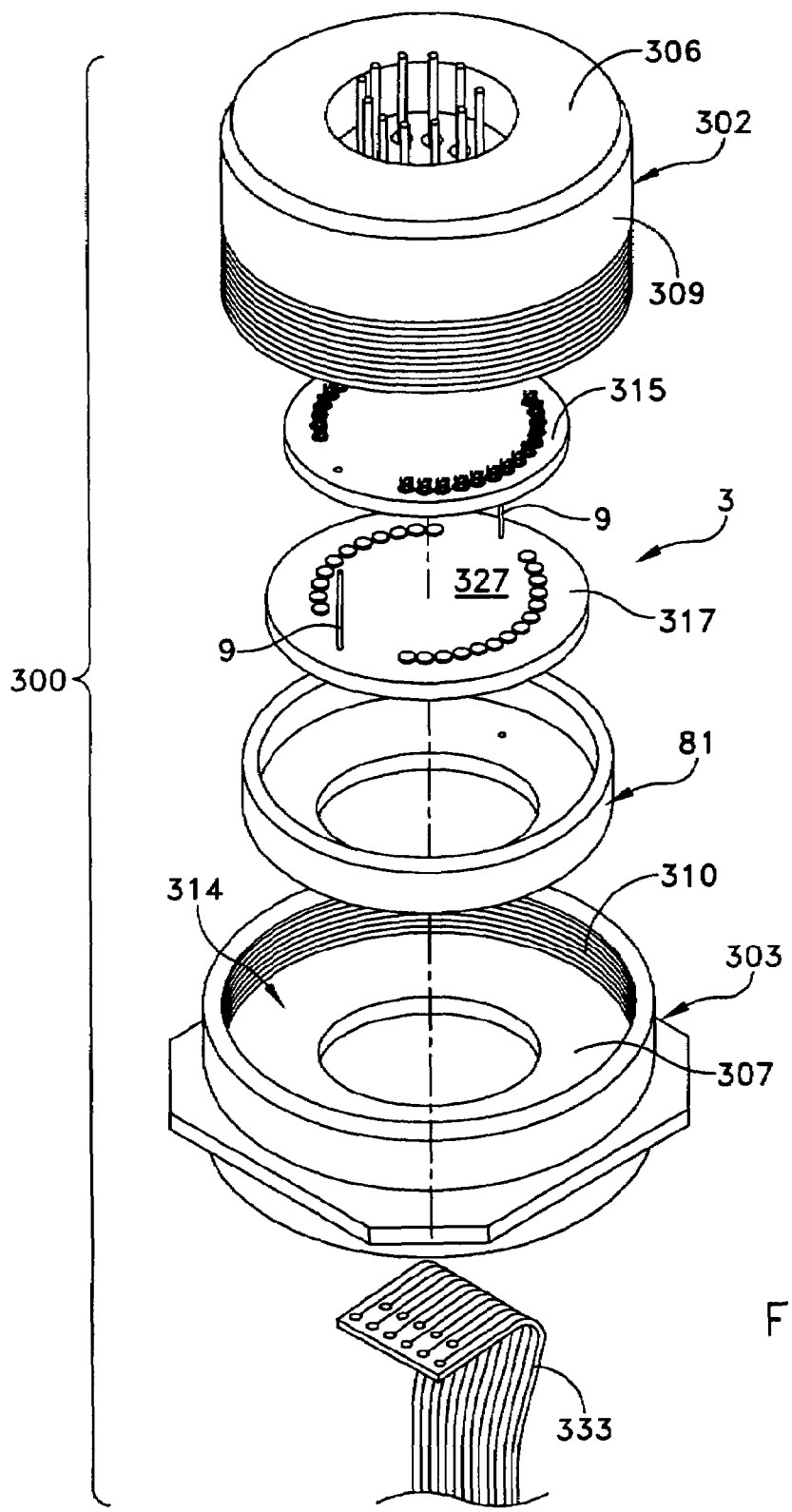
FIG. 22 is an exploded perspective view of a wire-to-ribbon cable connector system formed in accordance with the present invention.

Referring to FIGS. 1, 16, and 22, a wide variety of electrical interconnection systems and connectors may be formed in accordance with the present invention, such as a wire-to-wire connector system 100, a board-to-board connector system 200, or a wire-to-ribbon connector system 300. In these and other connector systems one or more electrical contacts 2 are arranged in an interposer assembly 3 including a contact interposer 5, one or more terminal headers 7, and one or more pilots 9 (FIGS. 1–2 and 11–14). Interposer assembly 3 provides for proper alignment and orientation of electrical contacts 2 within the particular connector system where, owing to the resilient structure of electrical contact 2 which has a significantly increased elastic range and high speed signal transmission characteristics, the connector system provides enhanced operating characteristics as compared to prior art electrical interconnection systems.

Figure 2:
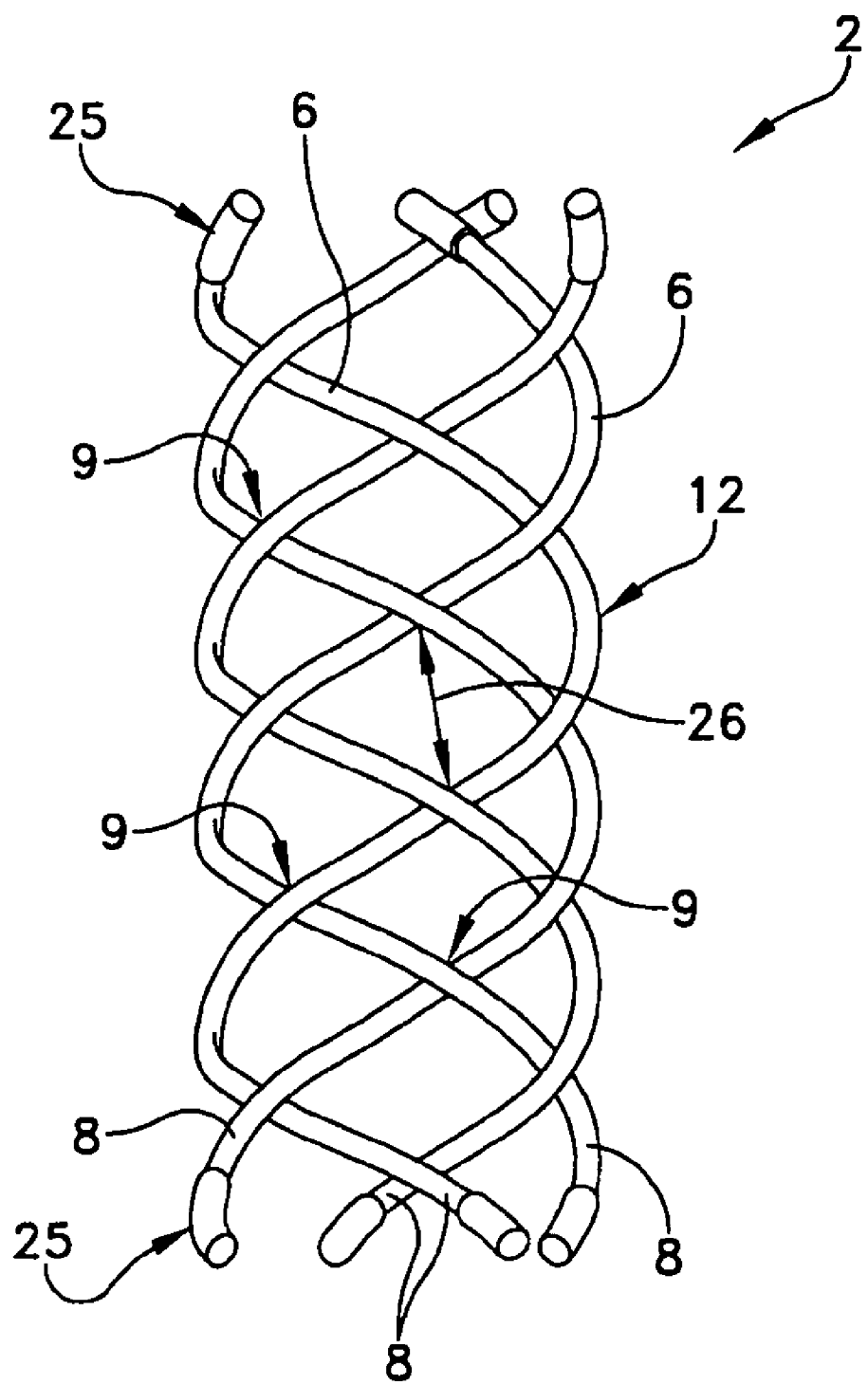
FIG. 2 is a perspective view of a woven electrical contact of a type used in connection with one embodiment of the present invention.
Figure 6:
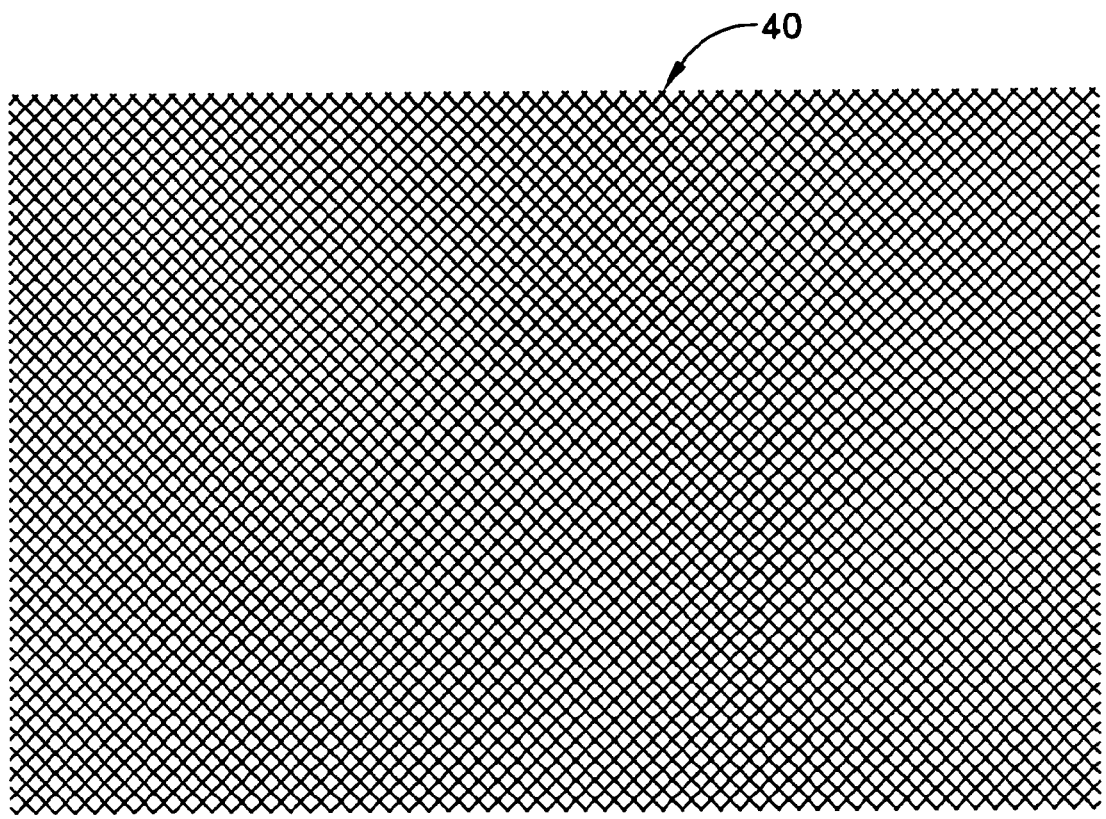
FIG. 6 is a top elevational view of an embodiment of wire mesh used to form an alternative electrical contact that may be used with the present invention.
Figure 7:
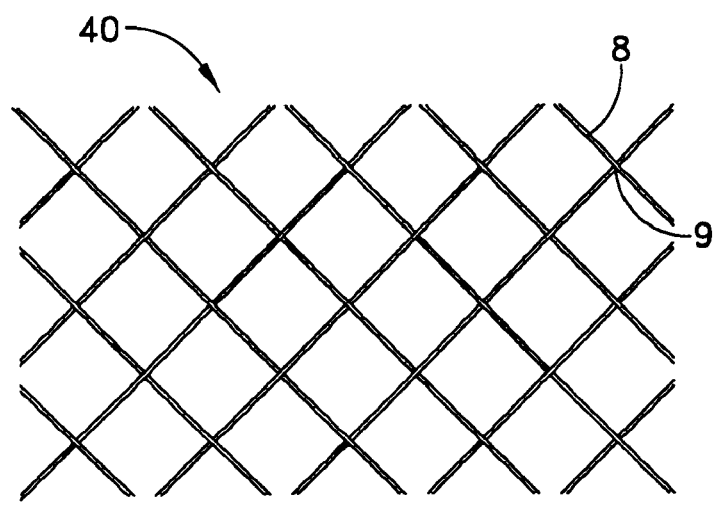
FIG. 7 is a magnified view of the mesh shown in FIG. 6.
Figure 8:
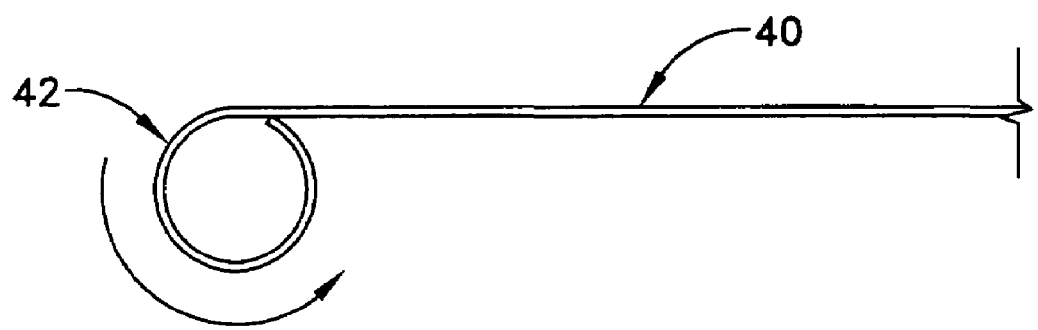
FIG. 8 is a top view of the mesh shown in FIG. 7, illustrating the process of being rolled into a tubular contact.

More particularly, electrical contacts 2 each comprise a large elastic range as a result of being formed so as to comprise an interlaced or woven, annealed metal structure that provides a plurality of individual beam-sections 6 (FIG. 2). Electrical contact 2 may be formed by weaving at least three or four discrete wires 8 together, i.e., manipulating the wires together so as to interlace them to form a unitary structure, to thereby form an electrical contact precursor mesh 12 in either a tubular configuration (FIGS. 2–3) or a sheet (FIGS. 6–8).

Advantageously, the tubular embodiments of the present invention are free standing, requiring no central or longitudinal interiorly located support structure around which the wires are wound or, an outer or inner support structure within which the wires reside in a formed electrical contact configuration, since the combination of interlacing and annealing wires 8 removes the need for any additional integral or over-layed, co-extruded, or over-molded structural support. In other words, electrical contacts 2 can be operated for their intended purpose while simply comprising a mesh that has been manipulated to take a shape suitable for interconnecting two or more adjacent structures. It is in this sense then that electrical contacts 2 of the present invention are said to comprise an unsupported structure.

In one woven embodiment, three to eight stainless steel wires 8 are woven together to form a tubular electrical contact 2. In this arrangement, each wire 8 takes a helical path so as to be interlaced with each adjacent wire 8, while at the same time, each wire 8 only undergoes a substantially elastic deformation, i.e., each wire 8 would exhibit bending properties wholly consistent with the elastic limit portion of its underlying material's characteristic "stress-strain" or "force-deflection" curve. Substantially no plastic deformation is caused to occur in wires 8 during this manufacturing step. Also, it should be understood that at the points of intersection/overlap 9 of wires 8 in mesh 12, no bonding or other mechanical interconnection exists between the adjacent portions of wires 8. As a result of this structural arrangement, the adjacent portions of each wire 8 that define each of the intersection/overlap points 9 are movable relative to one another. It has been found, in braided or interlaced structures, that mechanical stability may be achieved when the ratio of the diameter of the contact and the lay length is smaller than about two-thirds, when cut into short segments even after annealing, where the lay length is the length per wire turn. Thus electrical contacts 2 having a diameter less than about five mils may be manufactured with adequate results.

Significantly, once woven tubular electrical contact 2 is annealed so as to stress relieve wires 8, particularly at the plurality of intersection/overlap points 9. Metals, such as stainless steel and copper, comprise a generally cubic crystal structure. It is the particular variation of this crystalline structure (face-centered-cubic) that gives these metals their ductility allowing for elastic bending of wires 8 into curved shapes, e.g., by winding or braiding about a removable mandrel 20 (FIG. 3) However in the present invention, wires 8 suffer no such defect dislocation or plastic deformation during weaving. Instead, annealing elastically deformed wires 8 in mesh 12 substantially eliminates the elastic strain stored within the wires so that slippage of the metal crystals occurs in a controlled manner. In this way, the metal is composed of regular crystals that have taken a set in their woven configuration by relieving the elastic strain induced in each wire by the interlacing or weaving process. Thus, instead of wires 8 springing apart when cut into individual electrical contacts 2, they tend to maintain their combined structural integrity, and remain woven together.

In the present invention, the forming of electrical contacts 2 involves only essentially elastic deformation in rolling, braiding, and other processes. Under elastic deformation the formed structure cannot be maintained without a supporting constraint. Otherwise the structure will fall apart as a result of elastic rebound. Advantageously, electrical contacts 2 may be formed by constraining them in a precursor form, then annealing them at a sufficiently high temperature which together with the stored elastic stress, allows dislocations to be generated and moved so as to permanently set the shape of the electrical contact thus relaxing the stored elastic strain. The extent of deformation in the elastic range is limited so that the shape of the wire cross-section, for example, will not be altered and it will be easier to design the die or other means of constraint.

Figure 9:
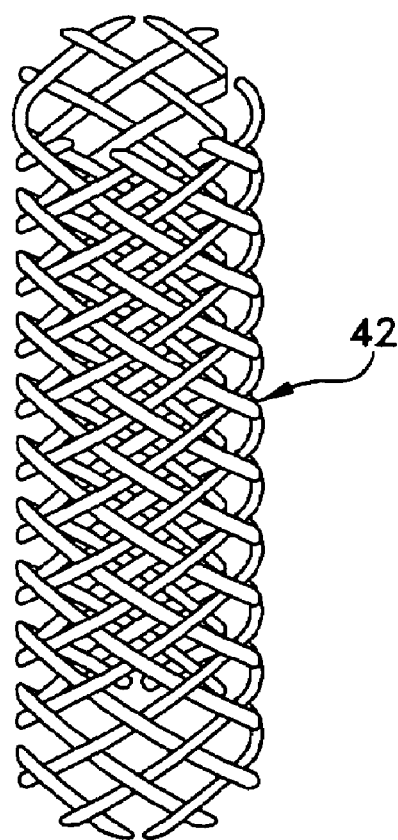
FIG. 9 is a perspective view of the tubular contact shown in FIG. 8.
Figure 10:
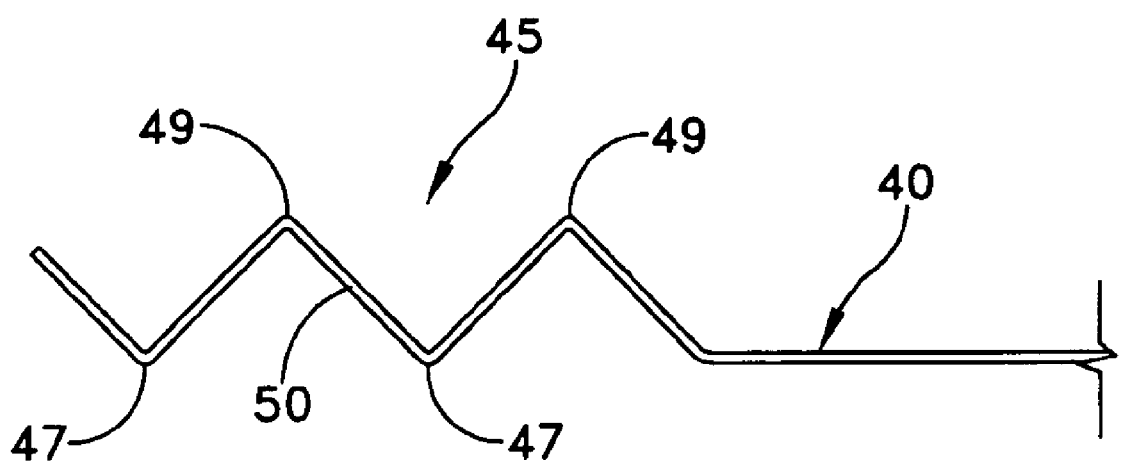
FIG. 10 is a top end view of a portion of the mesh shown in FIG. 7, after pleating so as to form yet another embodiment of electrical contact.

Referring to FIGS. 6, 7, and 10, a folded or pleated structure may be formed by annealing the structure while still elastically deformed in a properly designed die or other fixture which serves as the constraint. For a rolled electrical contact structure, a properly designed constraint to maintain the tubular form is necessary during annealing (FIGS. 8 and 9). In one embodiment, mesh 12 is wrapped upon itself so as to form a plurality of overlapping layers providing a substantially helical structure to the tube. In the case of a braided tubular structure, before cutting, the structure itself acts as a constraint during annealing.

The annealing of mesh 12 relieves the elastic strain that is inherent in wires 8 as a result of the weaving process, particularly at intersection/overlap points 9 where wires 8 are elastically deformed so as to bend or curve. Absent this annealing step and structure, wires 8 and mesh 12 would simply spring apart in the absence of any additional internal or external support structure affixed to mesh 12, e.g., a polymeric or elastomeric support core or shell. The combination of weaving individual wires 8 into a structure having inherent macro-elastic properties, with an annealing step to set the individual wires 8 in their woven structural arrangement, provides for significantly enlarged force deflection properties. Thus when woven into mesh 12 according to the invention, and then annealed, plurality of wires 8 provide a resilient electrical contact structure having a significantly increased elastic range. To maintain a good surface condition heat treatment should be carried out in a controlled atmosphere furnace at the appropriate temperature for the particular grade of stainless steel or, in a less preferred embodiment, alloy of copper which may also be oil quenched to achieve maximum hardness.

Figure 3:
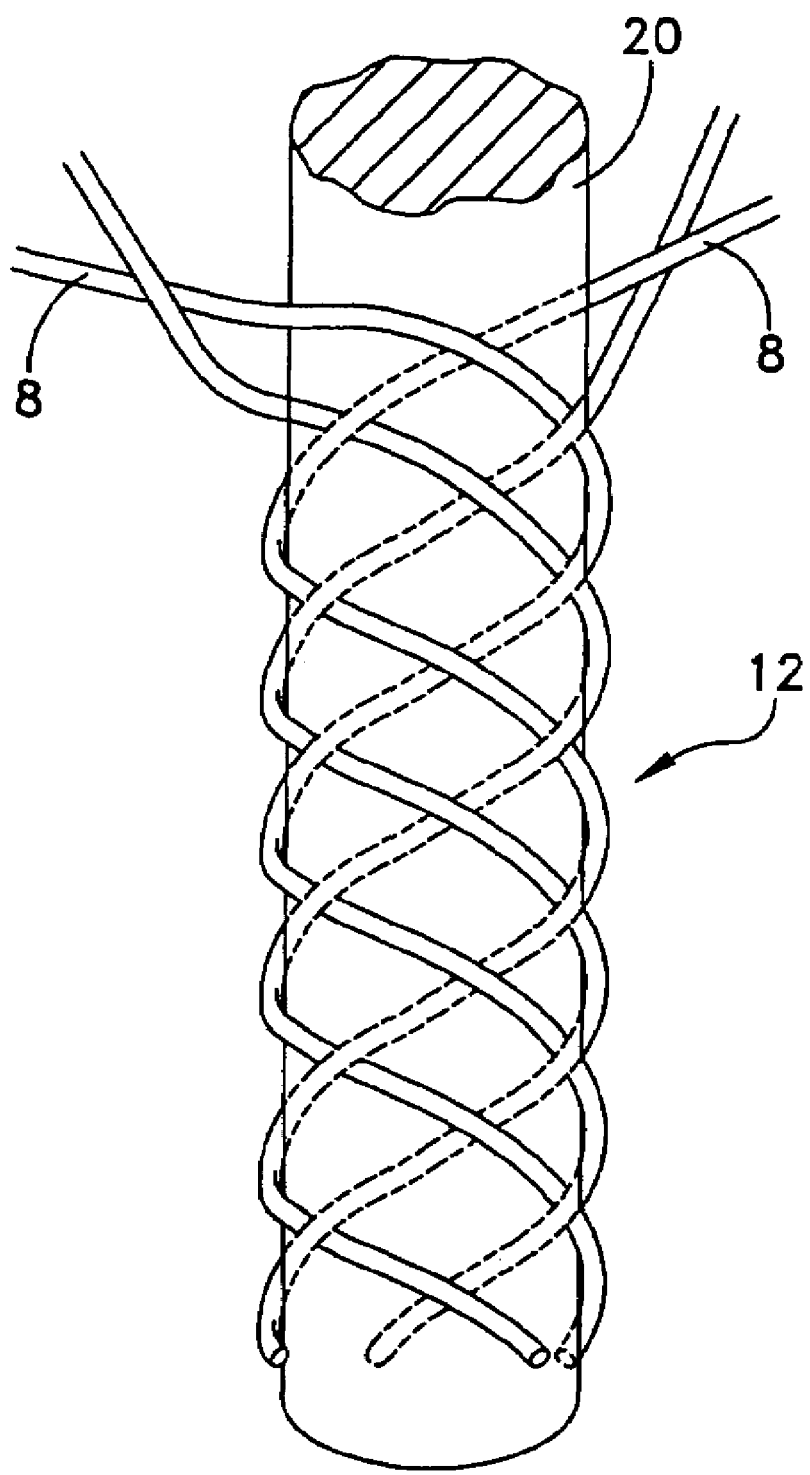
FIG. 3 is a perspective view, partially in phantom, illustrating the winding of individual wires about a central core during the manufacture of the electrical contact shown in FIG. 2.

According to the present invention, electrical contact 2 may be fabricated from three, four, or more loosely woven or braided conductive fibers or wires using, e.g., a conventional wire braiding machine (not shown). For example, wire braiding machines have long been used in industry to braid metallic or composite wire into electrical or electronic cable as an electromagnetic shield, or into hydraulic hose and cordage as a load bearing structure. One such braiding machine that is suitable for forming electrical contact 2 is a maypole type machine wherein carriers for bobbins carrying the individual wires 8 to be woven, are moved by horn gears or notched rotors on a deck with all of the carriers following alternating circular or arcuate paths around a braiding point. In the present invention, the braiding point may be disposed along a removable cylindrical mandrel 20, or some other removable center support (FIG. 3). Half the bobbin carriers travel in one direction around the braiding point (located along removable cylindrical mandrel 20) following one alternating path, while the other half of the carriers travel in the opposite direction around the braiding point following another alternating path which crosses the first path at each alternating direction. As the two sets of carriers travel in opposite directions around the braiding point, each crossing the path of the other, the wires leaving the bobbins are interwoven as they converge to the braiding point. A continuous tube of electrical contact precursor material is drawn from the conventional wire braiding machine. The electrical contact precursor is then annealed followed by processing through a cutting station where it is cut transversely into individual electrical contacts 2. Such machines are well known in the art, e.g., as disclosed in U.S. Pat. Nos. 3,783,736; 5,085,211; 5,257,571; and 5,931,077, which are all incorporated herein by reference.

Another type of braiding machine useful for forming electrical contact 2 is known as a rotary braiding machine (not shown). In these machines, there is a set of inner carriers, a set of outer carriers and a set of strand deflectors located between the inner and outer carriers. The inner and outer carriers are rotated so as to follow a circular path about the braiding point in opposite directions. The deflectors stand in the pathway of the strands from the outside carriers. These deflectors cause the wires from the outer carrier to cross the path of the inner carrier thus interweaving the wires. The interwoven wires then converge to the braiding point to form the woven electrical contact 2. Here again, a continuous tube of electrical contact precursor material is drawn from the rotary braiding machine, annealed, and then processed through a cutting station where it is cut transversely into individual electrical contacts 2. Such machines are also well known in the art, e.g., as disclosed in U.S. Pat. No. 4,275,638, which patent is incorporated herein by reference.

Figure 12:
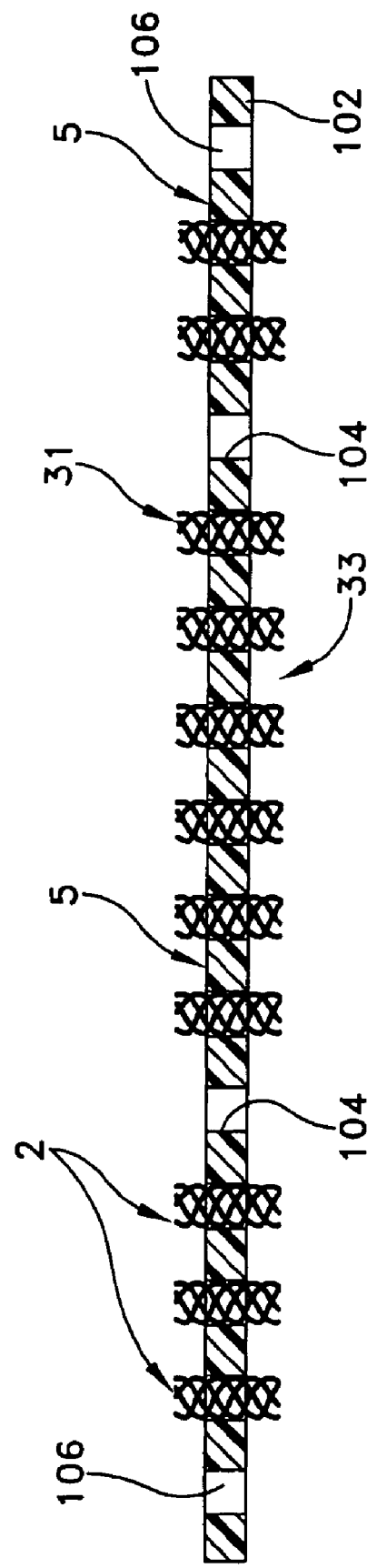
FIG. 12 is a partially cross-sectional view of a contact interposer and electrical contacts arranged in accordance with the present invention.

Suitable electrically-conductive fibers or wires include virtually any fiber material having a bulk resistivity below about 100 $\mu\Omega$-cm, and preferably about 2 to 5 $\mu\Omega$-cm. Typically, the electrically-conductive fibers will be conductive metal wires, such as, tungsten and its alloys, stainless steel, or alloys of copper, that may have portions coated with highly conductive metals (identified by reference numeral 25 in FIG. 2), such as, silver, palladium, rhodium, gold, and the various alloys thereof. These highly conductive metals may extend along a first interconnect portion 31 or a second interconnect portion 33 of each electrical contact 2 (FIG. 12). Alternatively, suitable electrically conductive fibers can be prepared by modifying electrically insulating fibers, such as by introducing a conductivity-imparting agent, e.g., metal particles, to a natural or synthetic polymer or other material, such as carbon. While polymer composites may not be able to withstand typical annealing temperature, a ceramic/metal composite may be used with good effect.

Figure 4:
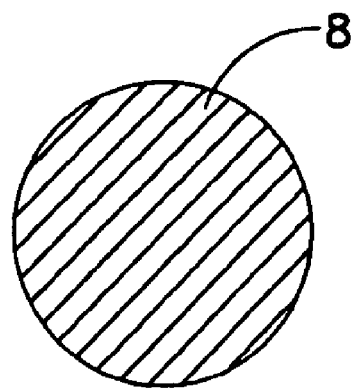
FIG. 4 is a cross-sectional view of a wire of the type used in forming the electrical contact shown in FIGS. 2 and 3.
Figure 5:
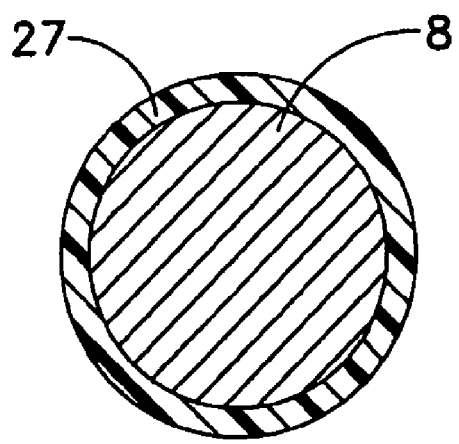
FIG. 5 is a cross-sectional view, similar to FIG. 4, but showing an insulating layer placed on the outer surface of wire.

Typically, electrically-conductive wires suitable for use in the present invention will have a diameter in the range from about 0.025 to 0.1 millimeters. The spacing between adjacent conductors (identified by reference numeral 26 in FIG. 2) are typically in the range from about 0.1 to 0.5 millimeters as measured between opposing wire intersection points 9. Referring to FIGS. 4 and 5, wires 8 may either be bare or have an insulation coating 27 applied to their outer surface. In all cases, the weave should be sufficiently loose, with gaps or interstices remaining between adjacent wires 8 so that during longitudinally applied compression, wires 8 form a plurality of elastically deformable beam-sections 6 so as to provide a required spring force. Advantageously, electrical contact 2 is subjected to an annealing process so as to substantially set each individual wire 8 in its bent or curved shape and as a structural element or constituent of woven mesh 12. Annealing for a stainless steel wire is conducted at temperatures ranging from about 500° C. to about 600° C., with about 550° C. being preferred for most applications.

Figure 13:
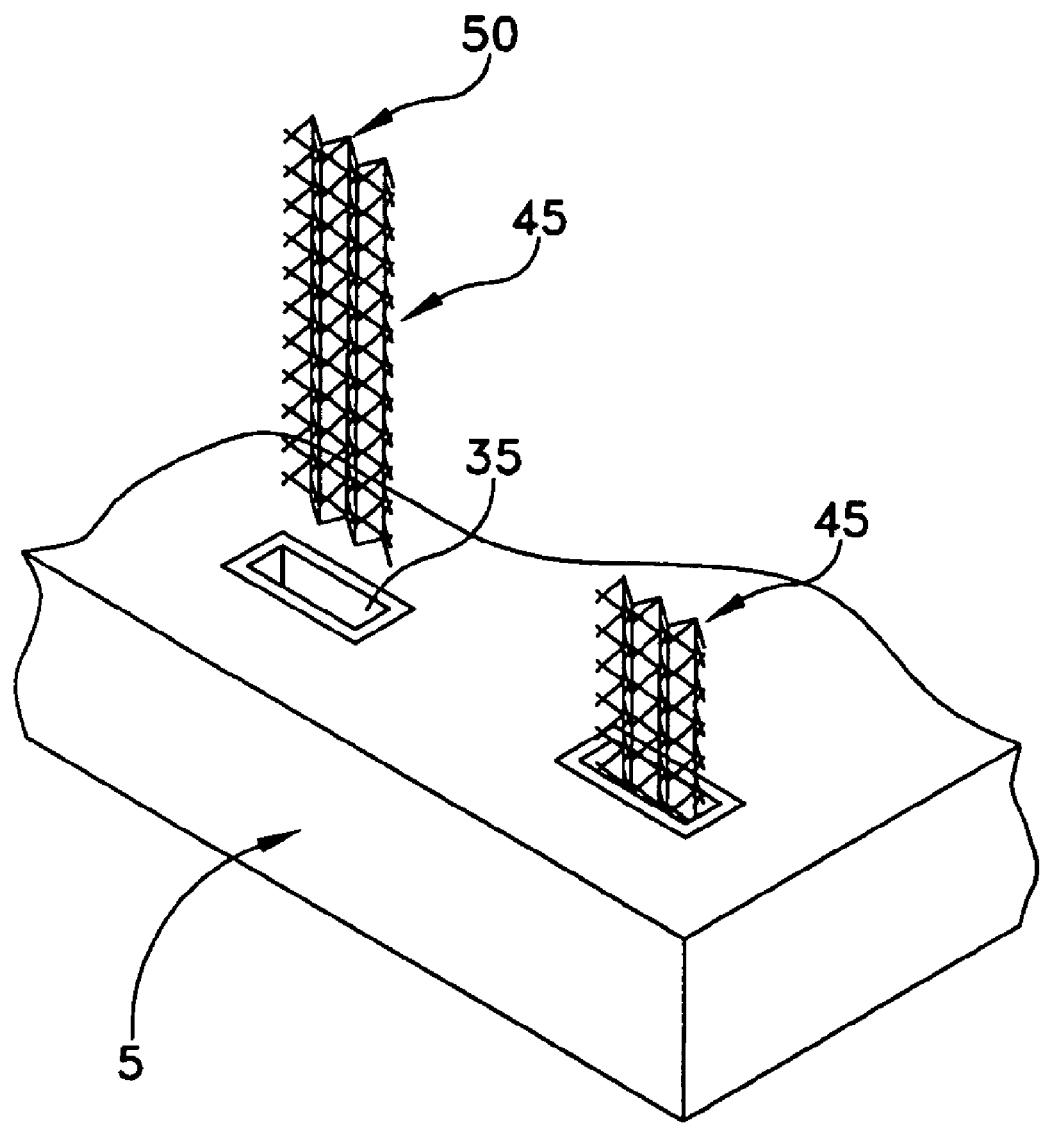
FIG. 13 is a perspective, partially exploded view of an alternative contact interposer accepting pleaded electrical contacts formed in accordance with the present invention.

In one alternative embodiment of the invention, wires 8 may be woven into an initially flat mesh 40 (comprising warp and weft wires) which then may be formed so as to create a variety of contact structures (FIGS. 6 and 7). For example, mesh 40 may be rolled upon itself so as to form a rolled contact 42 (FIGS. 8 and 9). Mesh 40 may be wrapped upon itself so as to form a plurality of overlapping layers providing a substantially helical structure to rolled contact 42. Each rolled contact 42 may then be cut from mesh 40 and assembled within a connector system, as will hereinafter be disclosed in further detail. Alternatively, mesh 40 may be folded so as to create a plurality of pleats 45 defined by a plurality of troughs 47 and ridges 49 (FIG. 10). A contact edge 50 is defined along the perimeter of pleats 45. Pleated electrical contacts 45 may then be cut from mesh 40. In this way, pleats 45 act to support the contact within openings 35 (FIG. 13). Engaging contact edge 50 of pleated electrical contact 45 deforms pleated electrical contact 45 to produce a resultant contact force. Here again, annealing pleated contact 45 or rolled contact 42 under a constraint allows for a set to be created in wires 8. In the case of pleated electrical contacts 45, a suitable forming tool, having a pleated punch and die set, may be closed on mesh 40 during the annealing process in order to maintain the structural arrangement in elastically formed wires 8.

Referring to FIGS. 1–2, and 11–20, electrical contacts 2 may be associated with a wide variety of electrical interconnection systems with good effect. For example, electrical contacts 2 may be positioned and supported within a wire-to-wire interconnection device 100. A typical wire-to-wire interconnection device 100 that is suitable for use with electrical contacts 2 includes a pair of substantially circular mateable dielectric housings 60 and 61 that are each molded from a suitable polymer material. Polymeric materials useful in this invention include any material useful in the electronics industry, including, without limitation, thermoplastics (crystalline or non-crystalline, cross-linked or non-cross-linked), thermosetting resins or blends or composites thereof. Illustrative examples of useful thermoplastic polymers include, without limitation, polyolefins, such as polyethylene or polypropylene, copolymers (including terpolymers, etc.) of olefins such as ethylene and propylene, with each other and with other monomers such as vinyl esters, acids or esters of unsaturated organic acids or mixtures thereof, halogenated vinyl or vinylidene polymers such as polyvinyl chloride, polyvinylidene chloride, polyvinyl fluoride, polyvinylidene fluoride and copolymers of these monomers with each other or with other unsaturated monomers, polyesters, such as poly(hexamethylene adipate or sebacate), poly(ethylene terephthalate) and poly(tetramethylene terephthalate), polyamides such as Nylon-6, Nylon-6,6, Nylon-6,10, Versamids, polystyrene, polyacrylonitrile, thermoplastic silicone resins, thermoplastic polyethers, thermoplastic modified cellulose, polysulphones and the like. Examples of some thermosetting resins useful herein include, without limitation, epoxy resins, such as resins made from epichlorohydrin and bisphenol A or epichlorohydrin and aliphatic polyols, such as glycerol, and which can be conventionally cured using amine or amide curing agents. Other examples include phenolic resins obtained by condensing a phenol with an aldehyde, e.g., phenol-formaldehyde resin.

Figure 11:
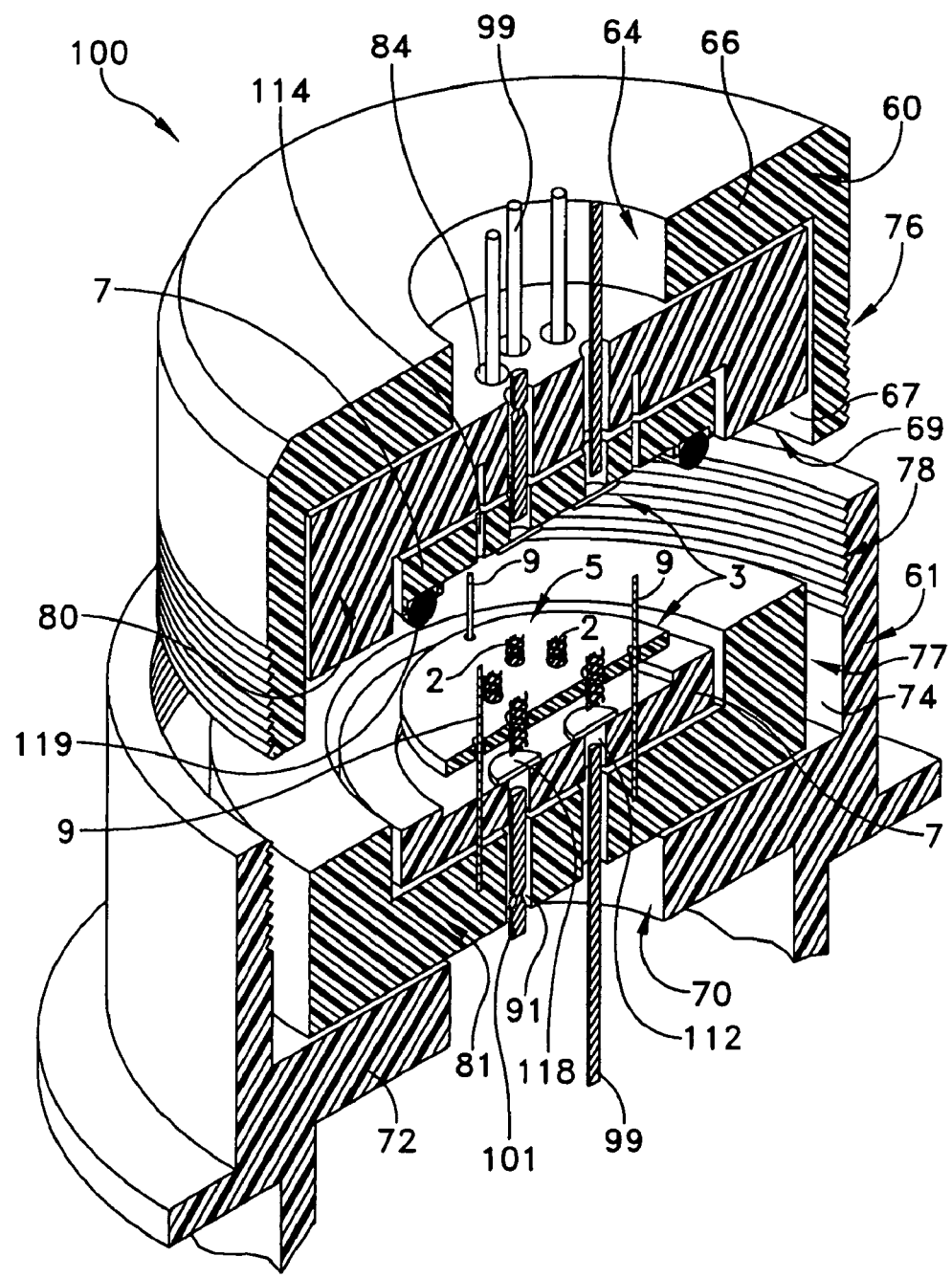
FIG. 11 is a cross-sectional perspective and exploded view of a wire-to-wire connector formed in accordance with the present invention.
Figure 14:
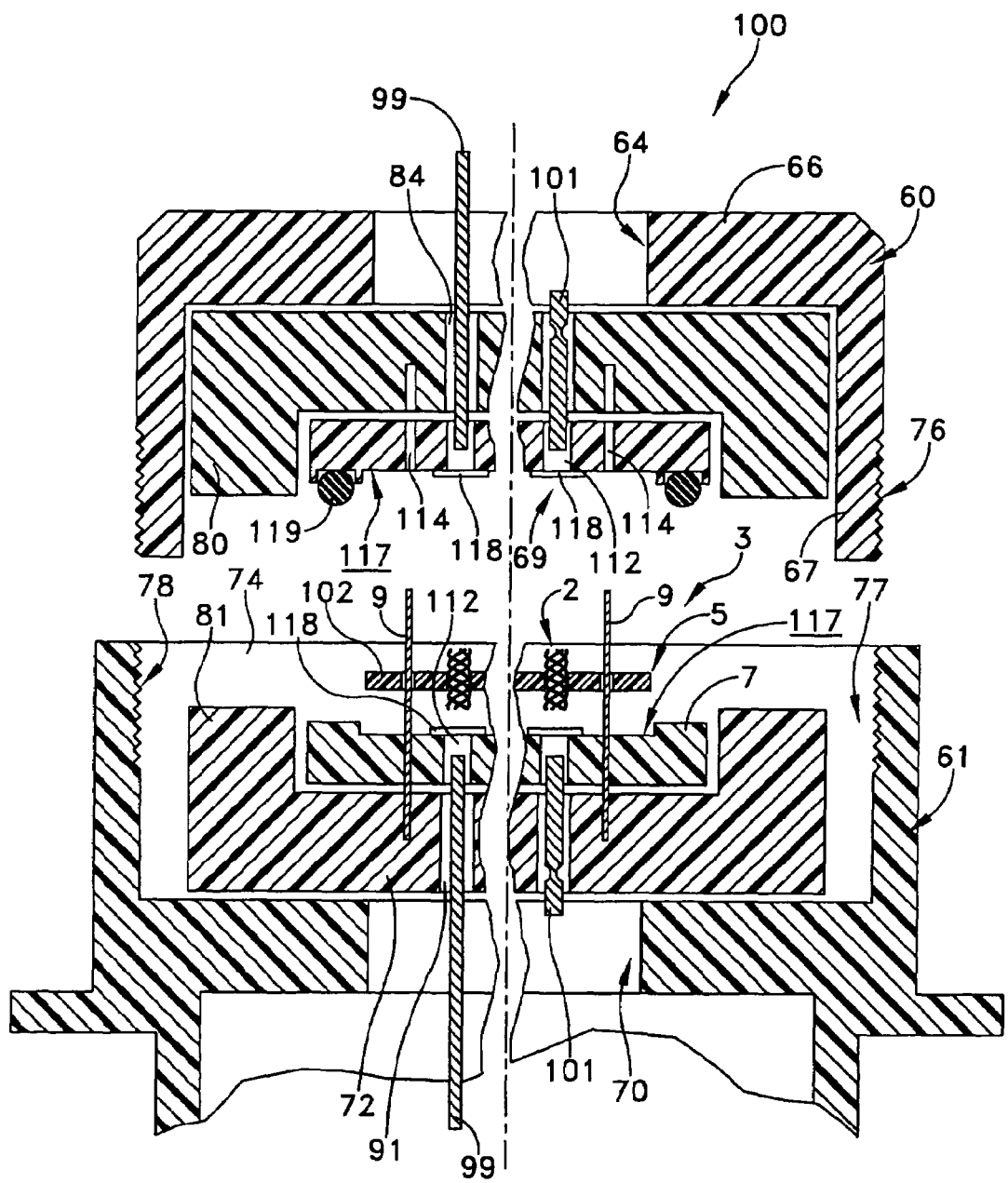
FIG. 14 is a cross-sectional view of the wire-to-wire connector shown in FIG. 11.
Figure 15:
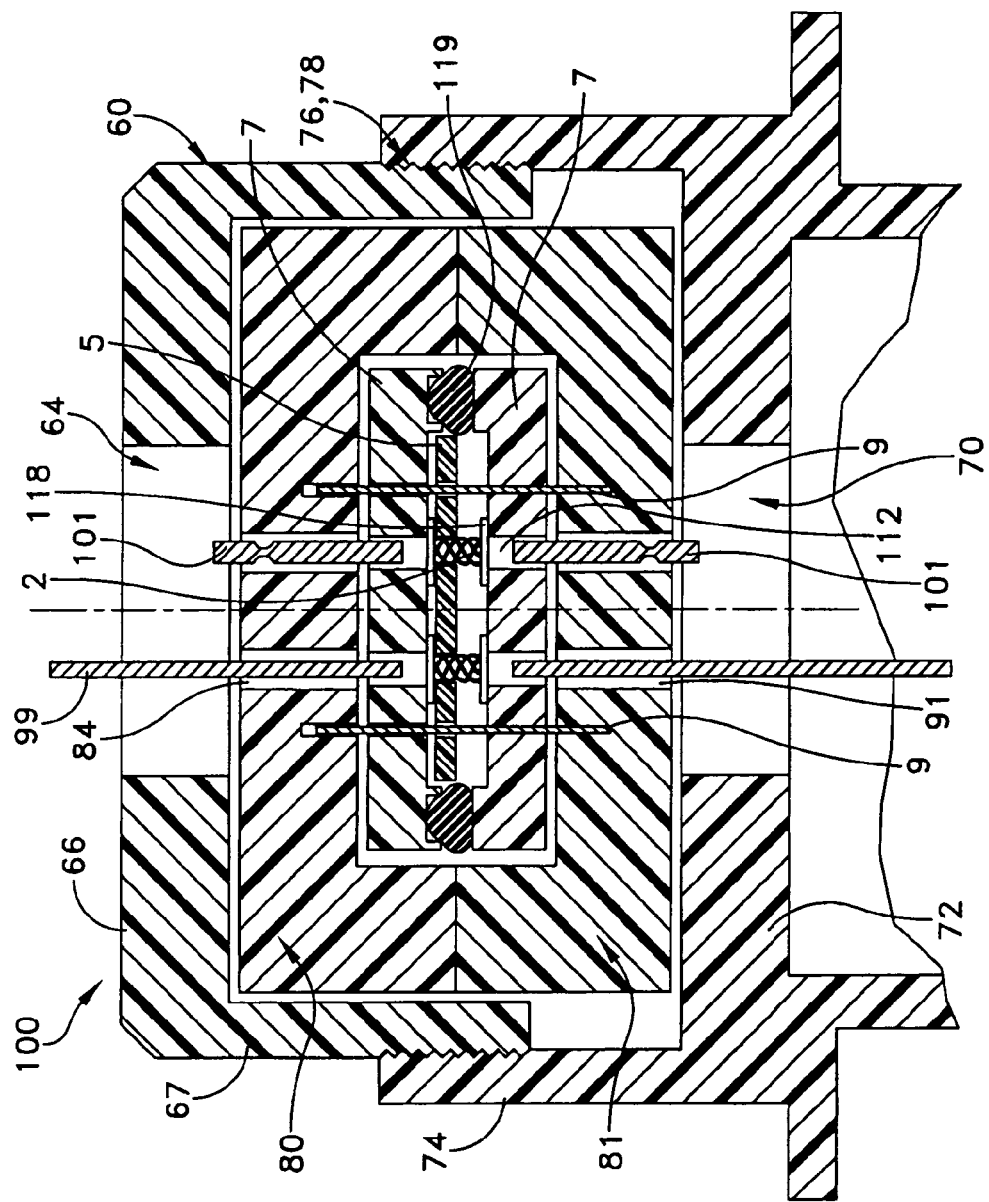
FIG. 15 is a cross-sectional view of a fully mated wire-to-wire connector shown in FIGS. 11 and 14.

Housing 60 often includes a conductor or wire-receiving passageway 64 extending through a base wall 66 and surrounded by an annular wall 67 that together define an interior recess 69 into which wire-receiving passageway 64 opens (FIG. 11). Housing 61 often includes a wire-receiving passageway 70 extending through a base wall 72 and surrounded by an annular wall 74 that together define an interior recess 77 into which wire-receiving passageway 70 opens. In the illustrated embodiment, annular wall 67 has an outer diameter that is slightly smaller than the inner diameter of annular wall 74, and includes threads 76 along a portion of its length so that housing 60 may be received in corresponding threads 78 on an inner surface of annular wall 74 of housing 61 (FIGS. 1 and 11–15). Thus when housing 60 is mated with housing 61 and rotated, the pair of housings 60,61 move toward one another so as to close the distance between the confronting inner surfaces of base walls 66 and 72 (FIG. 15). It will be understood that such wire-to-wire connector systems may include a wide variety of alternative structures for securely inserting housing 60 into housing 61, e.g., latches, bayonet mounts, interference fits, etc.

A pair of guide-cradles 80,81 are often located within housings 60,61 on the interior surface of base walls 66,72, respectively. Guide-cradle 80 often includes a wire-receiving passageway 84 extending through a mating face and surrounded by an annular wall that together define an interior recess into which wire-receiving passageway 84 opens. Guide-cradle 81 includes a wire-receiving passageway 91 extending through a mating face and surrounded by an annular wall that together define an interior recess into which wire-receiving passageway 91 opens. Guide-cradles 80, 81 provide support and organization for wires 99 entering housings 60,61. It will be understood that a wire-crimp contact terminal 101 may also be received within passageways 84,91 so as to form an electrical or signal transmission pathway.

Interposer assembly 3 includes a contact interposer 5, a pair of termination headers 7, and one or more pilot pins 9. Interposer assembly 3 is positioned between housings 60,61 with some portions located within housing 60 and other portions located on housing 61 (FIGS. 11 and 14). Contact interposer 5 is often formed from a standard epoxy and fiber glass printed wiring board (PCB) 102 having a plurality of through-bores 104 defined through its thickness and arranged in a regular pattern or array of predetermined shape and center-line spacing (FIG. 12). Of course, contact interposer 5 may comprise other materials, e.g., ceramics, polymers, and/or composite materials. One or more pilot holes 106 are defined through contact interposer 5. Electrical contacts 2 are lodged within through-bores 104 and fixed in place via a force fit, an adhesive material, or solder located within each through-bore 104 such that a first engagement portion 31 projects outwardly from a first side surface of contact interposer 5 and a second engagement portion 33 projects outwardly from a second side surface of contact interposer 5.

Termination header 7 may be formed from a standard epoxy and fiber glass printed wiring board (PCB) material having a plurality of through-bores 112 defined through its thickness and arranged in a regular pattern or array that is complementary to the pattern of through-bores 104 in contact interposer 5 (FIGS. 11, 14, and 15). One or more pilot holes 114 are also defined through portions of termination header 7 in locations that will allow for coaxial alignment with pilot holes 106 of contact interposer 5 when interposer assembly 3 is positioned within housings 60 and 61. Of course, termination headers 7 may comprise other materials, e.g., ceramics, polymers, and/or composite materials. Advantageously, through-bores 112 are plated throughout their internal length with a conductive metal, e.g., tin, gold, or the like, and closed off at an interior end. In this way, a terminal pad 118 is formed on face 117 of each terminal header 7 (FIG. 14) so as to hermetically seal through-bores 112 from the ambient environment, but provide an electrically conductive pathway to wires 99 or wire-crimp terminal contact 101. Terminal pads 118 are arranged on face 117 of each terminal header 7 in a regular pattern or array that is complementary to the pattern of through-bores 104 in contact interposer 5. An o-ring 119 or equivalent may be fixedly positioned on face 117 of one of terminal headers 7 so as to be in surrounding relation to the array of terminal pads 118.

Interposer assembly 3 is mounted within a wire-to-wire connector 100 in the following manner. Guide-cradles 80, 81 are first positioned within housing 60, 61, respectively, such that wire-receiving passageways 84 of guide-cradle 80 are arranged in coaxially aligned relation with wire-receiving passageway 64 of housing 60, and wire-receiving passageways 91 of guide-cradle 81 are arranged in coaxially aligned relation with wire-receiving passageway 70 of housing 61. Once in this position, a termination header 7 is positioned on each mating face of each guide-cradle 80, 81. In this position, terminal pads 118 face outwardly. Pilot pins 9 are then fixedly positioned within pilot holes 114 of at least one of termination headers 7 (shown within housing 61 in FIGS. 11, 14, and 15). It will be understood that guide-cradles 80,81 are mounted within housings 60,61 such that at least one of housings 60,61 may rotate freely about its respective guide-cradle. In this way, the positional and electrical correspondence between terminal pads 118 on each terminal header 7 will be maintained during mating of housing 60 to housing 61. With pilot pins 9 located in pilot holes 114, a contact interposer 5 may be positioned within the wire-to-wire connector system 100. More particularly, a contact interposer 5 having a plurality of electrical contacts 2 positioned within through-bores 104 is arranged in confronting coaxial relation with termination header 7 which has pilot pins 9 positioned within pilot holes 114. Once in this position, contact interposer 5 is moved toward termination header 7 so that pilot pins 9 are received within pilot holes 106. The tips of pilot pins 9 may then be swaged or otherwise capped so as to prevent contact interposer 5 from easily sliding off pilot pins 9.

Wire conductors 99 or wire-crimp terminal contact 101 are then inserted through wire-receiving passageways 64, 70, 84, and 91, respectively, so that a conductive end portion of each is positioned within a plated-through-hole 112 of each termination header 7 (FIG. 14). In this position, each wire 99 or wire-crimp terminal contact 101 is then soldered in place so as to create an electrical engagement and signal transmission pathway with the underside of a conductive pad 118 on each termination header 7.

With wires 99 or wire-crimp terminal contact 101 electrically engaged with termination headers 7, within housings 60, 61, housing 60 may be mated to housing 61 so as to complete wire-to-wire connector 100. Referring to the exemplary sequence illustrated in FIGS. 14 and 15, housing 60 is oriented so as to be in confronting coaxial relation with housing 61 such that threads 76 on the lower outer surface of annular wall 67 engage corresponding threads 78 of annular wall 74 of housing 61. Once in this position, one of housings 60, 61 is rotated relative to the other so as to cause threads 76, 78 to engage one another and thereby pull housings 60, 61 toward one another. As this occurs, conductive pads 118 on termination header 7 of housing 60 move toward engagement portions 31 of each electrical contact 2 that is positioned in contact interposer 5. Conductive pads 118 engage electrical contacts 2 and thereby cause contact interposer 5 to slide toward housing 61 upon, and guided by pilot pins 9 so as to move engagement portions 33 of each electrical contact 2 towards conductive pads 118 of termination header 7 positioned within housing 61. Engagement portions 33 of each electrical contact 2 thus engage conductive pads 118 of termination header 7 in housing 61 so as to complete each electrical circuit.

Figure 17:
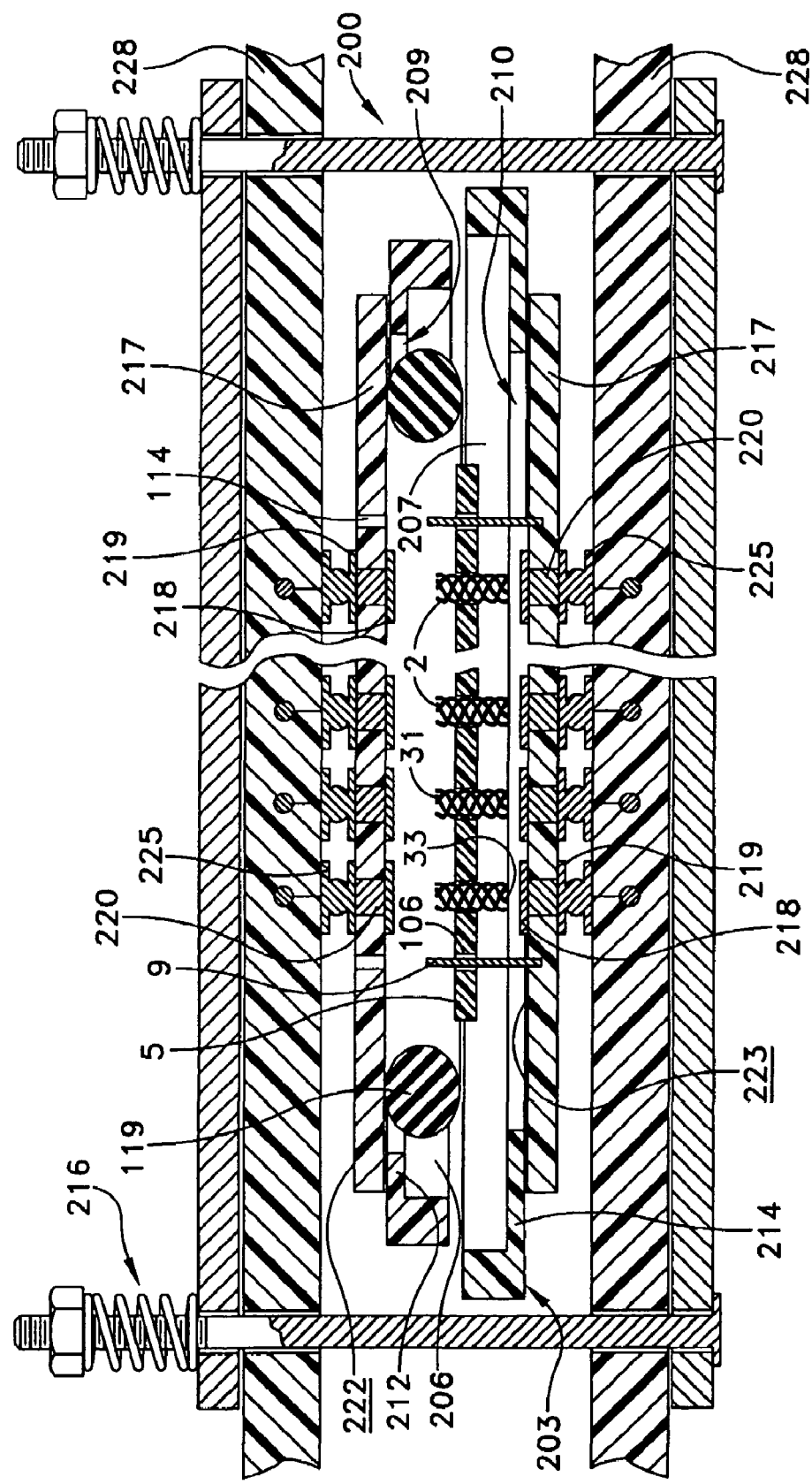
FIG. 17 is a cross-sectional view of the board-to-board connector system shown in FIG. 16.
Figure 18:
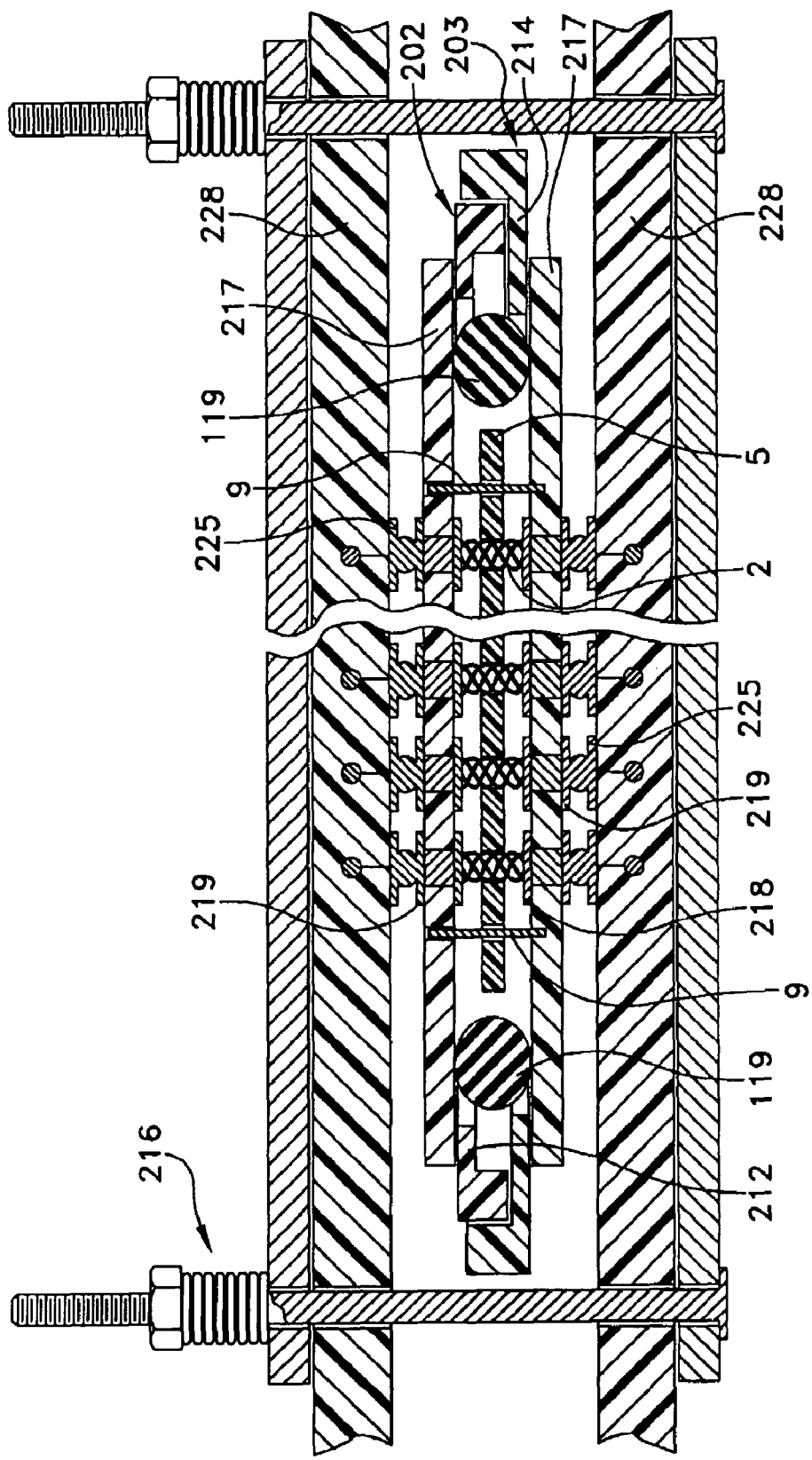
FIG. 18 is a cross-sectional view similar to that shown in FIG. 17, but illustrating a fully mated position.

Of course a wide variety of connector systems may employ interposer assembly 3 so as to operate in accordance with the present invention. For example, a board-to-board connector system 200 may be formed having a interposer assembly 3 as follows. Referring to FIGS. 16–18, in simplified form a board-to-board connector system 200 may include a pair of mateable housings 202,203 in which interposer assembly 3 may be positioned. Of course, interposer assembly 3 may be employed for board-to-board applications without the use of housings 202,203 with adequate results (e.g., board-to-board connector system 201 shown in FIGS. 19–21). In an embodiment that includes housings, each will often include an annular side wall 206,207 that surrounds a centrally disposed opening 209, 210, with an annular ledge 212,214 that is arranged to project into the opening from the bottom of annular side wall 206,207 (FIG. 17). In the illustrated embodiment, annular wall 206 is slightly smaller than annular wall 207 so that housing 202 may be received within a portion of housing 203. Thus when housing 202 is mated with housing 203, the pair of housings move toward one another so as to close the distance between the confronting inner surfaces of annular ledge 212,214 (FIG. 18). It will be understood that such board-to-board connector systems may include a wide variety of alternative structures for securely inserting and holding housing 202 in engagement with housing 203, e.g., latches, an interference fit, a threaded rod, nut and spring mounting system 216, etc.

Interposer assembly 3 includes a contact interposer 5, a pair of termination headers 217, and one or more pilot pins 9, and is positioned between housings 202,203 with some portions located on housing 202 and other portions located on housing 203 (FIGS. 17 and 18). Contact interposer 5 is again formed from a standard epoxy and fiber glass printed wiring board (PCB) 102 having a plurality of through-bores 104 defined through its thickness and arranged in a regular pattern or array of predetermined shape and center-line spacing (FIGS. 12 and 17). One or more pilot holes 106 are defined through contact interposer 5. Electrical contacts 2 are lodged within through-bores 104 and fixed in place within each through-bore 104 as previously described, such that a first engagement portion 31 projects outwardly from a first side surface of contact interposer 5 and second engagement portion 33 projects outwardly from a second side surface of contact interposer 5 (FIG. 12).

Termination headers 217 are also formed from a standard epoxy and fiber glass printed wiring board (PCB) material having a plurality of conductive vias 220 defined through their thicknesses and arranged in a regular pattern or array that is complementary to the pattern of through-bores 104 in contact interposer 5. One or more pilot holes 114 are again defined through portions of each termination header 217 in locations that will allow for coaxial alignment with pilot holes 106 when interposer assembly 3 is positioned on housings 202 and 203. Vias 220 may comprise plated-through holes that extend through the thickness of each termination header 217, and that are plated along their internal length with a conductive metal, e.g., tin, gold, or the like, and closed off at both ends. Alternatively, vias 220 may be solid or semi-solid, electrically conductive structures, e.g., slugs or posts of copper, carbon, or other electrically conductive materials. In this way, a pair of terminal pads 218,219 are formed on both outer faces 222, 223 of each terminal header 217 so as to provide an electrically conductive pathway to corresponding terminal pads 225 located on printed wiring board 228 (FIG. 17). An o-ring 119 or equivalent may be fixedly positioned on outer face 223 of one of terminal headers 217 so as to be in surrounding relation to the array of terminal pads 218, if sealing is required for a particular application.

Figure 19:
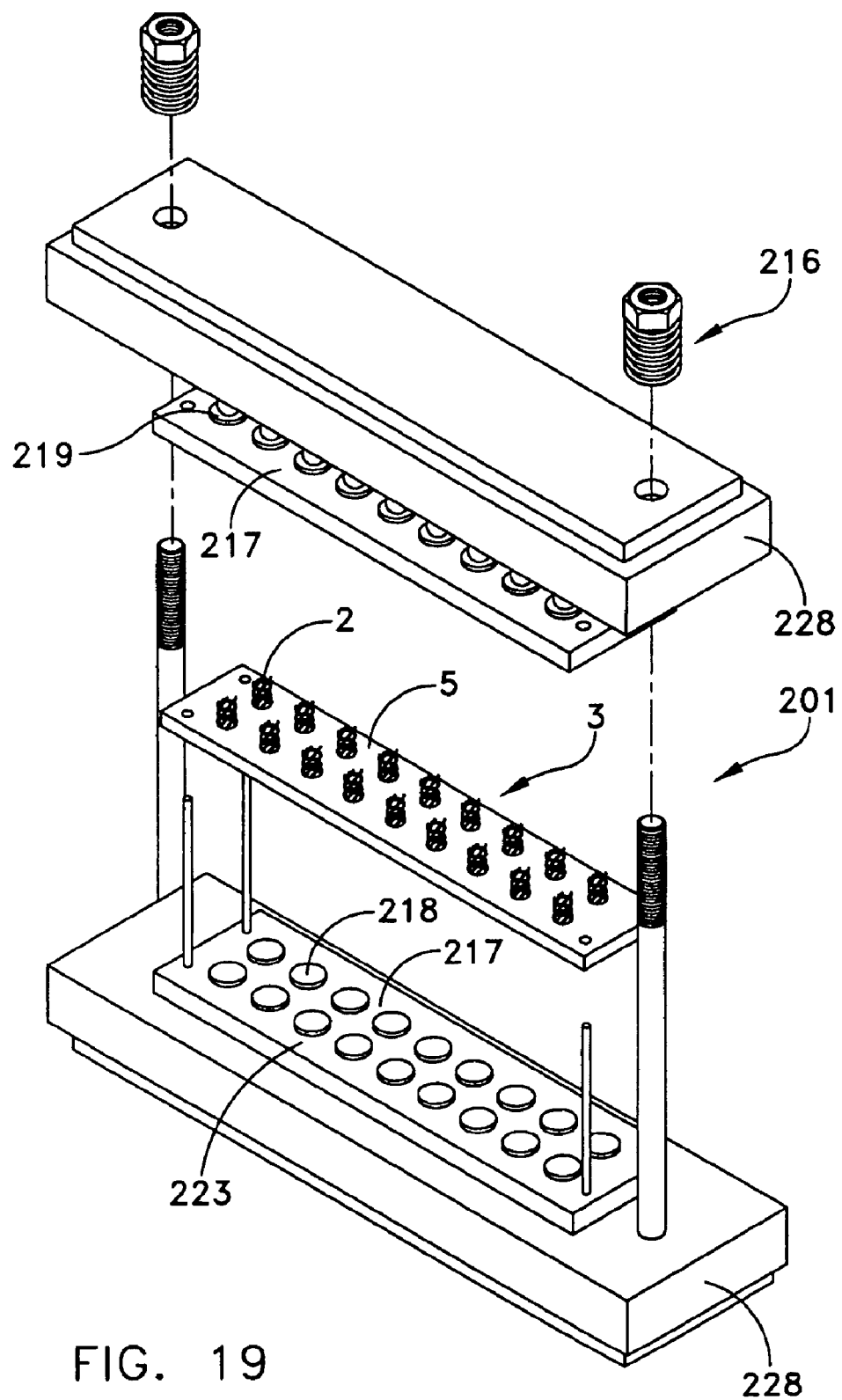
FIG. 19 is a perspective exploded view of a board-to-board connector system similar to that shown in FIG. 16, but without housings.
Figure 20:
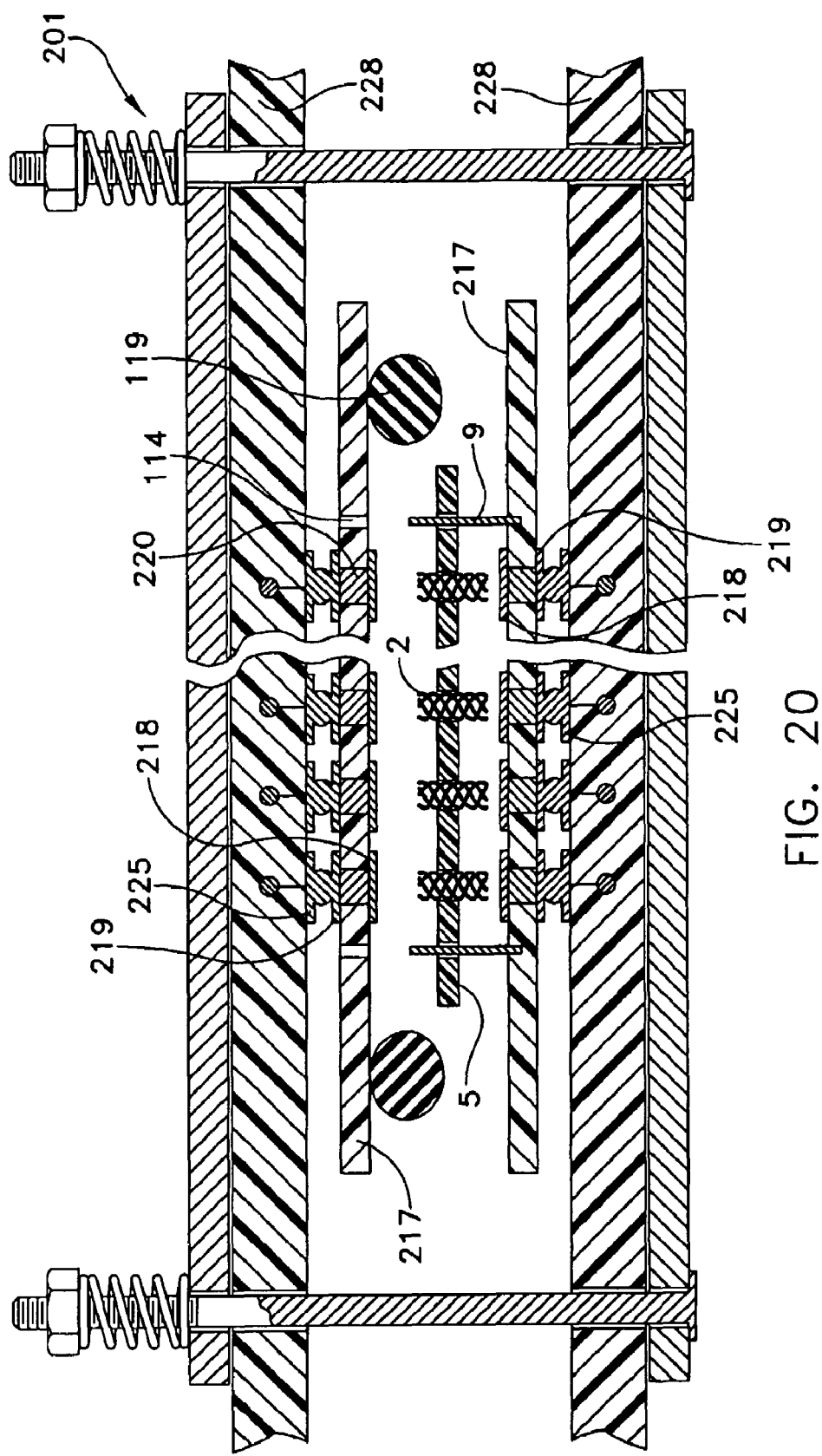
FIG. 20 is a cross-sectional view of a board-to-board connector system shown in FIG. 19.
Figure 21:
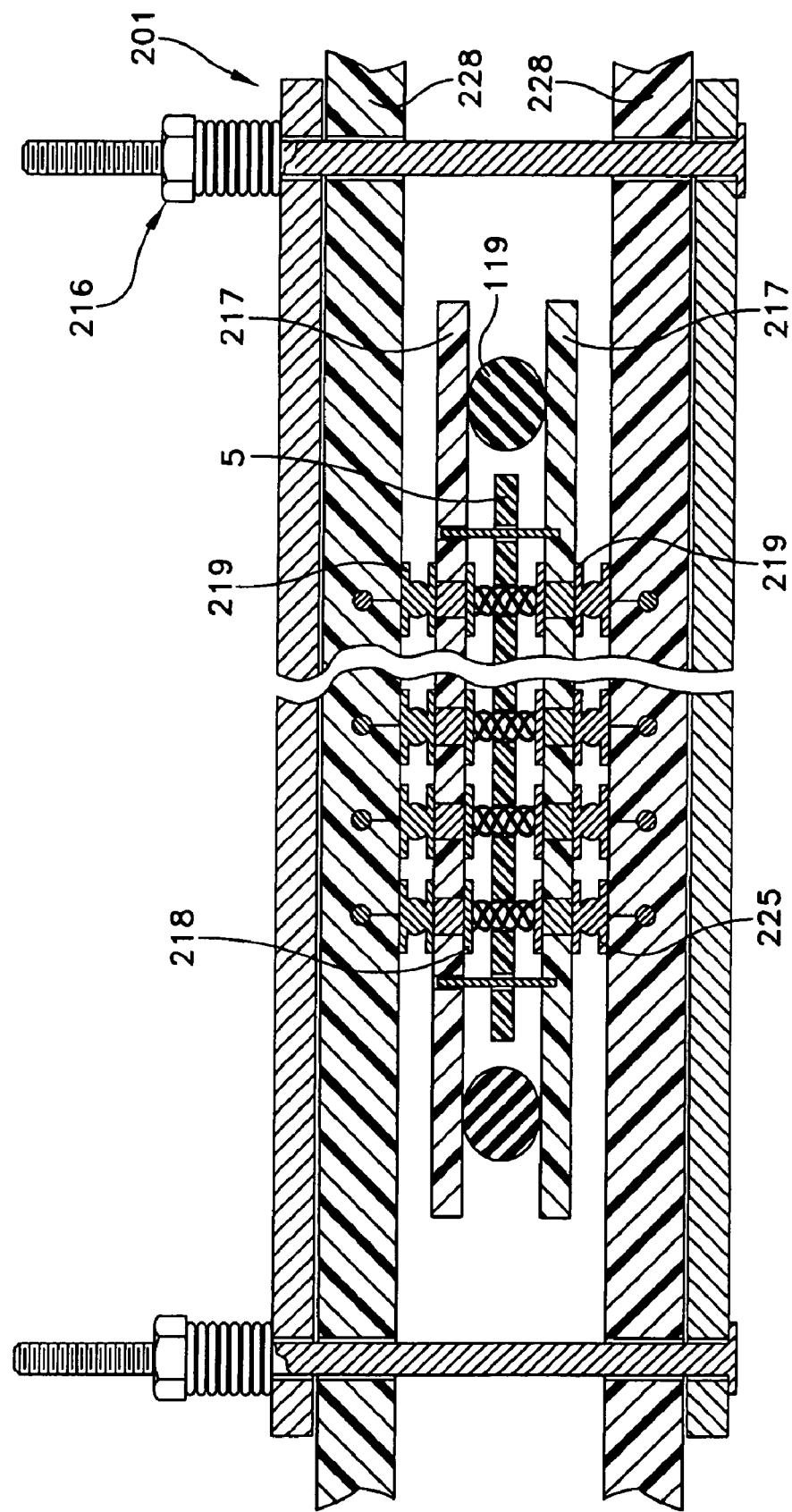
FIG. 21 is a cross-sectional view similar to that shown in FIG. 20, but illustrating a fully mated position.

Interposer assembly 3 is mounted within a board-to-board connector system 200 in much the same manner as with wire-to-wire connector system 100. More particularly, termination headers 217 are positioned such that a peripheral edge surface of each outer face 223 engages a respective annular ledge 212,214 of housings 202,203. In this position, terminal pads 218 face outwardly toward the corresponding pads 225 on printed wiring board 228. Pilot pins 9 are then fixedly positioned within pilot holes 114 of at least one of termination headers 217 (shown within housing 203 in FIGS. 16, 17, and 18). With pilot pins 9 located in pilot holes 114, a contact interposer 5 may be positioned within the connector system 200. More particularly, a contact interposer 5 having a plurality of electrical contacts 2 positioned within through-bores 104 is arranged in confronting coaxial relation with termination header 217 which has pilot pins 9 positioned within pilot holes 114. Once in this position, contact interposer 5 is moved toward termination header 217 so that pilot pins 9 are received within pilot holes 106. The tips of pilot pins 9 may then be swaged or otherwise capped so as to prevent contact interposer 5 from sliding off pilot pins 9. In another embodiment, housing 202, 203 may be discarded with adequate results (FIGS. 19–21).

Housing 202 may be mated to housing 203 so as to complete board-to-board connector system 200 in the following manner. Referring to the exemplary sequence illustrated in FIGS. 17 and 18, housing 202 is oriented so as to be in confronting coaxial relation with housing 203 such that termination headers 217 are facing one another with contact interposer 5 positioned between them. Once in this position, housings 202, 203 are moved toward one another, e.g., by actuation of nut and spring mounting system 216. As this occurs, conductive pads 218 on termination header 217 of housing 202 move toward engagement portions 31 of each electrical contact 2 that is positioned in contact interposer 5. Conductive pads 218 engage electrical contacts 2 and thereby cause contact interposer 5 to slide toward housing 203 upon, and guided by pilot pins 9 so as to move engagement portions 33 of each electrical contact 2 towards conductive pads 218 of termination header 217 positioned within housing 203. Engagement portions 33 of each electrical contact 2 thus engage conductive pads 218 of termination header 7 in housing 203 so as to complete each electrical circuit.

Figure 23:
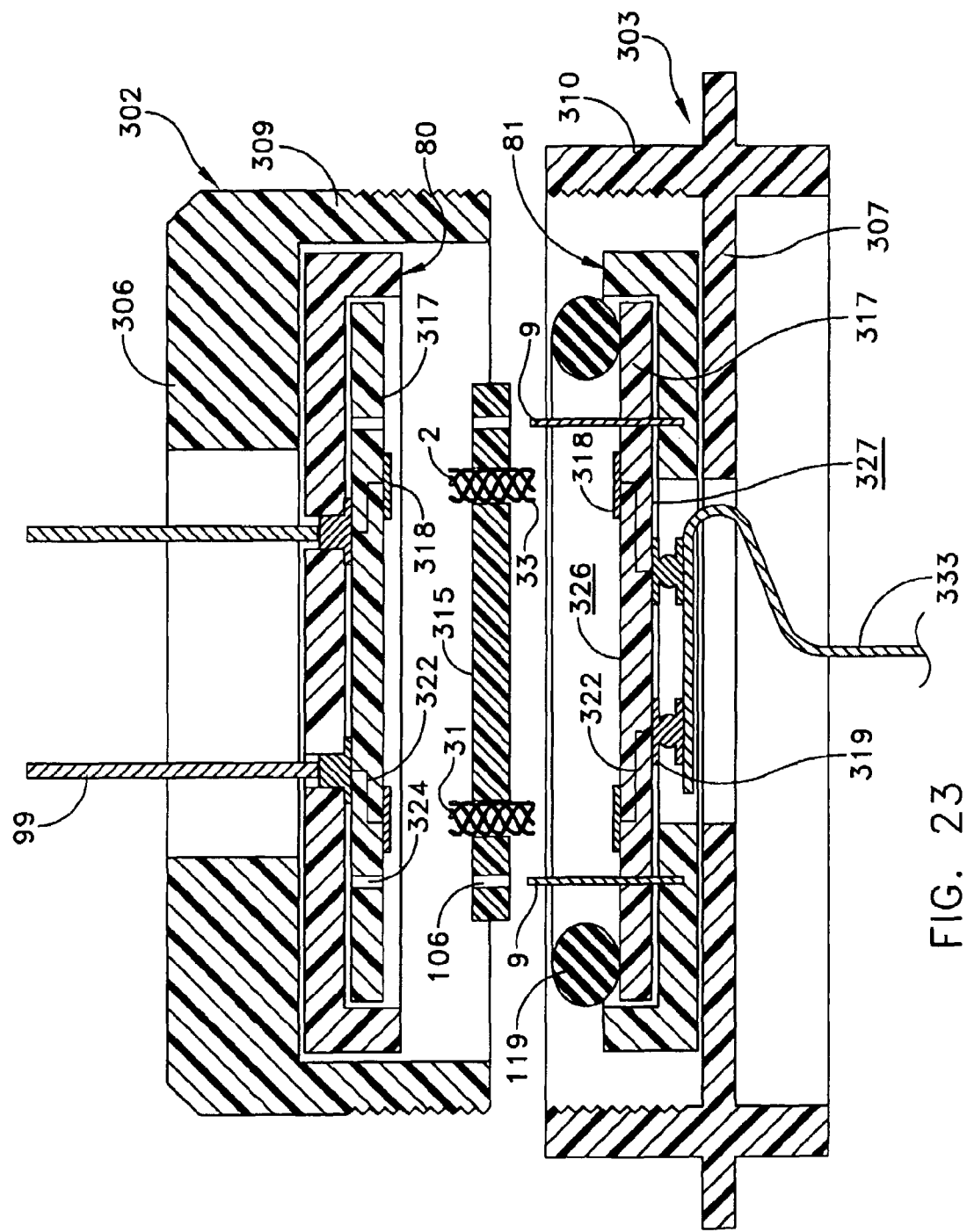
FIG. 23 is a cross-sectional exploded view of the wire-to-ribbon cable connector system shown in FIG. 19.
Figure 24:
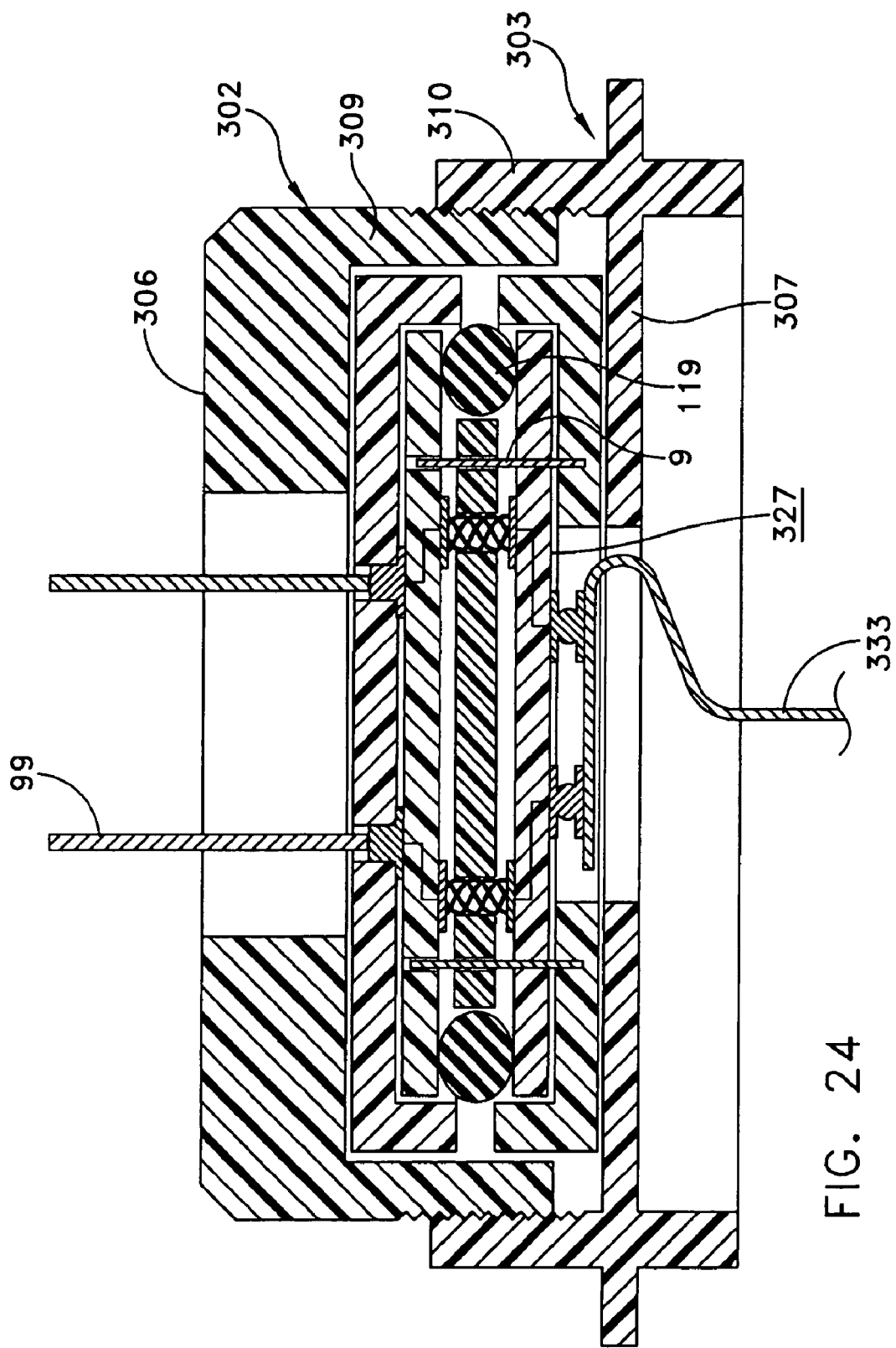
FIG. 24 is a cross-sectional view similar to that shown in FIG. 23, but illustrating a fully mated position.

In another example, a wire-to-ribbon cable connector system 300 may be formed having a interposer assembly 3 as follows. Referring to FIGS. 22–24, in simplified form a wire-to-ribbon connector system 300 includes a pair of mateable housings 302,303 in which interposer assembly 3 may be positioned upon guide-cradles 80, 81 as previously discussed hereinabove. In this embodiment, each housing 302,303 includes a base wall 306,307 that is surrounded by an annular wall 309,310. Base wall 310 defines an interior recess 314 within housing 303. In the illustrated embodiment, annular wall 309 is slightly smaller in diameter than annular wall 310 so that housing 302 may be received within a portion of housing 303. Thus when housing 302 is mated with housing 303, the pair of housings move toward one another so as to close the distance between the confronting inner surfaces of base walls 306,307 (FIG. 22–24). It will be understood that wire-to-ribbon connector system 300 may include a wide variety of alternative structures for securely inserting and holding housing 302 in engagement with housing 303, e.g., latches, an interference fit, a threaded rod, bayonet mount, etc.

Interposer assembly 3 includes a contact interposer 315, a termination header 317, one or more pilot pins 9, and is positioned between housings 302,303 with some portions located on housing 302 and other portions located on housing 303. A pair of guide-cradles 80,81 are often located within housings 302,303 on the interior surface of base walls 306,307, respectively, and as previously described hereinabove. Contact interposer 315 is formed from a standard epoxy and fiber glass printed wiring board (PCB) 102 having a plurality of through-bores 104 defined through its thickness and arranged in a regular pattern or array of predetermined shape and center-line spacing (see, FIG. 12) however in a wire-to-ribbon embodiment of the invention electrical contacts 2 are often arranged in a circular pattern. It should be noted that contact interposer 315 may have a wide variety of physical shapes, as dictated by a particular connector structure. One or more pilot holes 106 are defined through contact interposer 315. Electrical contacts 2 are lodged within through-bores 104 and fixed in place within each through-bore 104 as previously described, such that a first engagement portion 31 projects outwardly from a first side surface of contact interposer 5 and second engagement portion 33 projects outwardly from a second side surface of contact interposer 5.

Termination headers 317 may be formed from a standard epoxy and fiber glass printed wiring board material having a plurality of interconnect 322 arranged through their thicknesses. One or more pilot holes 324 are defined through portions of termination header 317 in locations that will allow for coaxial alignment with pilot holes 106 when interposer assembly 3 is positioned on housings 302 and 303. In this embodiment, interconnect 322 may be plated-through-holes or solid conductive structures or combination of both, e.g., tin, gold, or the like, and closed off at both ends. In this way, a pair of terminal pads 318, 319 are formed on outer faces 326, 327 of terminal header 317 so as to provide an electrically conductive pathway to corresponding wires 99 and ribbon cable 333 (e.g., via solder) within base walls 306,307, respectively (FIG. 22–24). Terminal pads 318 are arranged on outer face 326 of terminal header 317 in a regular pattern or array that is complementary to the pattern of through-bores 104 in contact interposer 315. An o-ring 119 or equivalent may be fixedly positioned adjacent to outer face 326 of terminal headers 317 so as to be in surrounding relation to the array of terminal pads 318.

Interposer assembly 3 is mounted within a wire-to-ribbon connector system 300 in much the same manner as with wire-to-wire connector system 100 and board-to-board connector system 200. More particularly, termination header 317 is positioned on base wall 306 of housing 302. Pilot pins 9 are then fixedly positioned within pilot holes 324 of termination header 317 (shown within housing 302 in FIG. 20). With pilot pins 9 located in pilot holes 324, a contact interposer 315 may be positioned within the connector system. More particularly, a contact interposer 315 having a plurality of electrical contacts 2 positioned within through-bores 104 is arranged in confronting coaxial relation with housing 303 which has pilot pins 9 positioned within pilot holes 324. Once in this position, contact interposer 315 is moved toward housing 303 so that pilot pins 9 are received within pilot holes 106. The tips of pilot pins 9 may then be swaged or otherwise capped so as to prevent contact interposer 315 from sliding off pilot pins 9.

Housing 302 may be mated to housing 303 so as to complete wire-to-ribbon connector system 300. Referring to the exemplary sequence illustrated in FIGS. 23 and 24, housing 302 is oriented so as to be in confronting coaxial relation with housing 303 such that base walls 306,307 are facing one another with contact interposer 5 positioned between them. Once in this position, housings 302, 303 are moved toward one another so that housing 302 engages housing 302. As this occurs, conductive pads 318 on termination header 317 of housing 302 move toward engagement portions 31 of each electrical contact 2 that is positioned in contact interposer 315. Conductive pads 318 engage electrical contacts 2 and thereby cause contact interposer 315 to slide toward housing 303 upon, and guided by pilot pins 9 so as to move engagement portions 33 of each electrical contact 2 towards conductive pads 318 positioned within housing 303. Engagement portions 33 of each electrical contact 2 thus engage conductive pads 323 in housing 303 so as to complete each electrical circuit.

It is to be understood that the present invention is by no means limited only to the particular constructions herein disclosed and shown in the drawings, but also comprises any modifications or equivalents within the scope of the claims.

What is claimed is:

1. A connector system comprising:
a first housing having a first header positioned on a mating face, said first header including at least one conductive pad that is in electrical communication with a conductor,
a second housing that is mateable with said first housing and including a second header positioned on a mating face, said second header including at least one conductive pad that is electrically engaged with a conductor and is positioned in confronting relation with said at least one conductive pad of said first header; and
an interposer located between said first header and said second header, with at least one woven comprising an annealed and unitary metal structure having a tubular configuration contact that extends continuously through said interposer so as to have a first portion projecting outwardly toward said at least one conductive pad of said first header and a second portion projecting outwardly toward said at least one conductive pad of said second header, wherein said interposer is movable between (i) a first position wherein said first and second portions of said at least one woven contact are spaced away from said at least one conductive pad, and (ii) a second position wherein said first and second portions of said at least one woven contact electrically engage said at least one conductive pad.

2. A connector system according to claim 1 wherein said first and second housings include a conductor receiving passageway extending through a base wall and surrounded by an annular wall that together define an interior recess into which wire-receiving passageway opens.

3. A connector system according to claim 1 comprising an o-ring fixedly positioned on a face of one of said first and second headers so as to be in surrounding relation to said at least one conductive pad.

4. A connector system according to claim 1 wherein said interposer includes at least one through-bore in which said woven contact is positioned so as to be located between said at least one conductive pad located on said first and said at least one conductive pad located on second headers.

5. A connector system according to claim 1 wherein said interposer includes woven contacts that are lodged within through-bores and fixed in place such that a first engagement portion of each of said woven contacts projects outwardly from a first side surface of said interposer and a second engagement portion of each of said woven contacts projects outwardly from a second side surface of said interposer.

6. A connector system according to claim 1 wherein each of said first and second headers includes a first face comprising at least one opening leading into at least one blind hole and a second face on which is located said at least one conductive pad.

7. A connector system according to claim 6 wherein said at least one blind hole is defined by a surface within said header including a layer of conductive metal and said at least one conductive pad is in electrical communication with said layer of conductive metal.

8. A connector system according to claim 1 wherein each of said first and second headers includes a first face comprising a plurality of openings each leading into a blind hole and a second face on which is located a plurality of conductive pads.

9. A connector system according to claim 8 comprising an o-ring fixedly positioned on a face of one of said first and second headers so as to be in surrounding relation to said plurality of conductive pads.

10. A connector system according to claim 8 wherein each of said plurality of blind holes is defined by a surface within said header including a layer of conductive metal, and further wherein one of each of said plurality of conductive pads is in electrical communication with said layer of conductive metal in one of said plurality of blind holes.

11. A connector system according to claim 10 wherein each of said plurality of conductive pads hermetically seals said blind bore from the ambient environment, and provides an electrically conductive pathway.

12. A connector system according to claim 1 comprising at least one pilot pin projecting outwardly from at least one of said first and second headers.

13. A connector system according to claim 12 wherein said interposer includes at least one pilot hole positioned so that each slidingly receives and guides one of said at least one pilot pin.

14. A connector system according to claim 1 comprising three pilot pins projecting outwardly from at least one of said first and second headers.

15. A connector system according to claim 14 wherein said interposer includes three pilot holes positioned so that each slidingly receives and guides one of said three pilot pins.

16. A connector system according to claim 1 further comprising a guide-cradle is located on an interior surface of at least one of said first and second housings, said guide-cradle defining a wire-receiving passageway extending through a mating face that is surrounded by an annular wall which together define an interior recess into which said wire-receiving passageway opens.

17. A connector system according to claim 16 wherein said guide-cradle provides support and organization for conductors entering said first and second housing.

18. A connector system according to claim 16 wherein at least one of said first header and said second header is positioned within said interior recess of said at least one guide-cradle, wherein each of said first and second headers includes a first face comprising a plurality of openings each (i) leading into a blind hole and, (ii) confronting said wire-receiving passageway, and a second face on which is located a plurality of conductive pads.

19. A connector system according to claim 18 wherein each of said plurality of blind holes is defined by a surface within said header including a layer of conductive metal, and further wherein one of each of said plurality of conductive pads is in electrical communication with said layer of conductive metal in one of said plurality of blind holes.

20. A connector system comprising:
a first housing having a first header including a plurality of conductive pads that are electrically engaged with a conductor;

a second housing that is mateable with said first housing and having a second header including a plurality of conductive pads that are positioned in confronting relation with said plurality of conductive pads on said first header; and an interposer located between said first header and said second housing, with a plurality of woven add comprising an annealed and unitary metal structure having a tubular configuration contacts extending continuously through said interposer so that each of said woven contacts has a first portion projecting outwardly toward a corresponding one of said plurality of conductive pads of said first header and a second portion projecting outwardly toward a corresponding one of said plurality of conductive pads of said second housing, wherein said interposer is movable between (i) a first position wherein said first and second portions of each of said plurality of woven contacts is spaced away from said corresponding one of said plurality of conductive pads of said first header, and (ii) a second position wherein said first and second portions of said plurality of woven contacts electrically engage said plurality of conductive pads of said first header and said second housing.

21. A connector system comprising:

a first header including a plurality of conductive pads that are each electrically engaged by one of a plurality of conductors;

a second header including a plurality of conductive pads that are each electrically engaged by one of a plurality of conductors, and are each positioned in confronting relation with a corresponding one of said plurality of conductive pads of said first header; and an interposer located between said first header and said second header, including a plurality of woven add comprising an annealed and unitary metal structure having a tubular configuration contacts that each extend continuously through said interposer so as to have a first portion projecting outwardly toward a corresponding one of said plurality of conductive pads of said first header and a second portion projecting outwardly toward a corresponding one of said plurality of conductive pads of said second header, wherein said interposer is movable between (i) a first position wherein said first portions of said woven contacts are spaced away from said conductive pads, and (ii) a second position wherein each woven contact electrically engages a corresponding one of said plurality of conductive pads of said first header and a corresponding one of said plurality of conductive pads of said second header.

22. A connector system comprising:

a first header including at least one conductive pad that is electrically engaged with a conductor;

a second header including at least one conductive pad that is electrically engaged with a conductor and is positioned in confronting relation with said at least one conductive pad of said first header; and an interposer supported between said first header and said second header, and longitudinally guided by pilot pins, with at least one woven contact comprising an annealed and unitary metal structure having a tubular configuration that extends continuously through said interposer so as to have a first portion projecting outwardly toward said at least one conductive pad of said first header and a second portion projecting outwardly toward said at least one conductive pad of said second header, wherein said interposer is movable between (i) a first position wherein said first portion of said at least one contact is spaced away from said at least one conductive pad of said first header, and (ii) a second position wherein said portions of said at least one contact electrically engage said conductive pads.

\* \* \* \* \*